(12) United States Patent
Hinkle et al.

(10) Patent No.: US 9,390,035 B2
(45) Date of Patent: Jul. 12, 2016

(54) METHOD AND APPARATUS FOR SUPPORTING STORAGE MODULES IN STANDARD MEMORY AND/OR HYBRID MEMORY BUS ARCHITECTURES

(75) Inventors: Jonathan R. Hinkle, Raleigh, NC (US); Paul Sweere, Foothill Ranch, CA (US)

(73) Assignee: SANMINA-SCI CORPORATION, San Jose, CA (US)

( * ) Notice: Subject to any disclaimer, the term of this patent is extended or adjusted under 35 U.S.C. 154(b) by 985 days.

(21) Appl. No.: 12/975,347

(22) Filed: Dec. 21, 2010

(65) Prior Publication Data

US 2011/0153903 A1 Jun. 23, 2011

Related U.S. Application Data

(60) Provisional application No. 61/288,548, filed on Dec. 21, 2009, provisional application No. 61/381,004, filed on Sep. 8, 2010, provisional application No. 61/424,672, filed on Dec. 19, 2010.

(51) Int. Cl.
| | |
|---|---|
| G06F 13/28 | (2006.01) |
| G06F 13/20 | (2006.01) |
| G06F 12/02 | (2006.01) |
| G06F 13/16 | (2006.01) |
| G11C 5/04 | (2006.01) |

(52) U.S. Cl.
CPC ............ *G06F 13/20* (2013.01); *G06F 12/0246* (2013.01); *G06F 13/1668* (2013.01); *G06F 13/1684* (2013.01); *G06F 13/1694* (2013.01); *G11C 5/04* (2013.01); *G06F 2212/205* (2013.01)

(58) Field of Classification Search
None
See application file for complete search history.

(56) References Cited

U.S. PATENT DOCUMENTS

| 7,616,206 | B1 * | 11/2009 | Danilak ...................... 345/505 |
| 2007/0016704 | A1 * | 1/2007 | Harari et al. .................. 710/68 |
| 2007/0140030 | A1 * | 6/2007 | Wyatt ............................ 365/212 |
| 2008/0040531 | A1 | 2/2008 | Anderson |

(Continued)

OTHER PUBLICATIONS

Scott Mueller, Upgrading and Repairing PCs, 18th Edition, Que, Sep. 27, 2007, Tables 6.19 and 6.20, http://my.safaribooksonline.com/9780789736970/ch06lev1sec15#X2ludGVybmFsX0h0bWxWa-WV3P3htbGlkPTk3ODA3ODk3MzY5NzAIMkZjaDA2bG-V2MXNIYzE2JnF1ZXJ5PQ==, http://my.safaribooksonline.com/9780789736970/ch06lev1sec16.*

(Continued)

*Primary Examiner* — Henry Tsai
*Assistant Examiner* — Juanito Borromeo
(74) *Attorney, Agent, or Firm* — Loza & Loza, LLP; Julio Loza

(57) ABSTRACT

A memory/storage module is provided that implements a solid state drive compatible with Serial Advanced Technology Attachment (SATA) or Serial Attached SCSI (SAS) signaling on a double-data-rate compatible socket. A detachable daughter card may be coupled to the memory module for converting a memory bus voltage to a second voltage for memory devices on the memory module. Additionally, a hybrid memory bus on a host system is provided that supports either DDR-compatible memory modules and/or SATA/SAS-compatible memory modules. In one example, the memory/storage module couples to a first bus (DDR3 compatible socket) to obtain voltage and/or other signals, but uses a second bus for data transfers. In another example, the memory module may repurpose/reuse electrical paths that typically carry non-data signals for data traffic to/from the memory/storage module. Such data traffic for the memory/storage module permits concurrent data traffic for other memory modules on the same memory bus.

24 Claims, 23 Drawing Sheets

(56) References Cited

U.S. PATENT DOCUMENTS

2008/0094808 A1* 4/2008 Kanapathippillai et al. .. 361/737
2008/0172513 A1   7/2008 Chen
2008/0294834 A1  11/2008 Merry, Jr. et al.
2009/0046533 A1*  2/2009 Jo ............................ 365/230.03
2009/0257184 A1* 10/2009 Lee et al. ................. 361/679.32
2009/0300259 A1  12/2009 Luo et al.
2010/0205470 A1*  8/2010 Moshayedi et al. .......... 713/340

OTHER PUBLICATIONS

International Search Report & Written Opinion for PCT/US10/61682 dated Sep. 20, 2011; 8 pages.

* cited by examiner

*MEMORY MODULE OPERATING USING BOTH A DDR MEMORY BUS AND A SATA MEMORY BUS*

MEMORY/STORAGE MODULE –
PERSPECTIVE VIEW

| Pin | Front Side | Pin | Back Side | Pin | Front Side | Pin | Back Side | Pin | Front Side | Pin | Back Side | Pin | Front Side | Pin | Back Side |
|---|---|---|---|---|---|---|---|---|---|---|---|---|---|---|---|
| 1 | NC | 121 | VSS | 31 | NC | 151 | VSS | 61 | NC | 181 | NC | 91 | NC | 211 | VSS |
| 2 | PD0 | 122 | NC | 32 | VSS | 152 | NC | 62 | VIN | 182 | VIN | 92 | VSS | 212 | NC |
| 3 | NC | 123 | NC | 33 | NC | 153 | NC | 63 | NC, CK1 | 183 | VIN | 93 | NC | 213 | NC |
| 4 | NC | 124 | VSS | 34 | NC | 154 | VSS | 64 | NC, CK1 | 184 | NC, CK0 | 94 | NC | 214 | VSS |
| 5 | VSS | 125 | NC | 35 | VSS | 155 | NC | 65 | VIN | 185 | NC, CK0 | 95 | VSS | 215 | NC |
| 6 | NC | 126 | NC | 36 | NC | 156 | NC | 66 | VIN | 186 | VIN | 96 | NC | 216 | NC |
| 7 | NC | 127 | VSS | 37 | NC | 157 | VSS | 67 | NC | 187 | EVENT_n | 97 | NC | 217 | VSS |
| 8 | VSS | 128 | NC | 38 | VSS | 158 | NC | 68 | NC | 188 | NC | 98 | VSS | 218 | NC |
| 9 | NC | 129 | NC | 39 | NC | 159 | NC | 69 | VIN | 189 | VIN | 99 | NC | 219 | NC |
| 10 | NC | 130 | VSS | 40 | NC | 160 | VSS | 70 | NC | 190 | NC | 100 | NC | 220 | VSS |
| 11 | VSS | 131 | NC | 41 | VSS | 161 | RSVD | 71 | NC | 191 | VIN | 101 | VSS | 221 | NC |
| 12 | NC | 132 | NC | 42 | RSVD | 162 | RSVD | 72 | VIN | 192 | NC | 102 | NC | 222 | NC |
| 13 | NC | 133 | VSS | 43 | RSVD | 163 | VSS | 73 | NC | 193 | NC | 103 | NC | 223 | VSS |
| 14 | VSS | 134 | NC | 44 | VSS | 164 | NC | 74 | NC | 194 | VIN | 104 | VSS | 224 | NC |
| 15 | NC | 135 | NC | 45 | NC | 165 | NC | 75 | VIN | 195 | NC | 105 | NC | 225 | NC |
| 16 | NC | 136 | VSS | 46 | NC | 166 | VSS | 76 | NC | 196 | NC | 106 | NC | 226 | VSS |
| 17 | VSS | 137 | NC | 47 | VSS | 167 | RSVD | 77 | NC | 197 | VIN | 107 | VSS | 227 | NC |
| 18 | NC | 138 | NC | 48 | NC | 168 | NC | 78 | VIN | 198 | NC | 108 | NC | 228 | NC |
| 19 | NC | 139 | VSS | 49 | NC | 169 | NC | 79 | NC | 199 | VSS | 109 | NC | 229 | VSS |
| 20 | VSS | 140 | NC | 50 | NC | 170 | VIN | 80 | VSS | 200 | NC | 110 | VSS | 230 | NC |
| 21 | NC | 141 | NC | 51 | VIN | 171 | NC | 81 | NC | 201 | NC | 111 | NC | 231 | NC |
| 22 | NC | 142 | VSS | 52 | NC | 172 | NC | 82 | NC | 202 | VSS | 112 | NC | 232 | RSVD |
| 23 | VSS | 143 | NC | 53 | NC | 173 | VIN | 83 | VSS | 203 | NC | 113 | VSS | 233 | NC |
| 24 | NC | 144 | NC | 54 | VIN | 174 | NC | 84 | NC | 204 | NC | 114 | NC | 234 | NC |
| 25 | NC | 145 | VSS | 55 | NC | 175 | NC | 85 | NC | 205 | VSS | 115 | NC | 235 | VSS |
| 26 | VSS | 146 | NC | 56 | NC | 176 | VIN | 86 | VSS | 206 | NC | 116 | VSS | 236 | VDDSPD |
| 27 | NC | 147 | NC | 57 | VIN | 177 | NC | 87 | NC | 207 | NC | 117 | SA0 | 237 | SA1 |
| 28 | NC | 148 | VSS | 58 | NC | 178 | NC | 88 | NC | 208 | VSS | 118 | SCL | 238 | SDA |
| 29 | VSS | 149 | NC | 59 | NC | 179 | VIN | 89 | VSS | 209 | NC | 119 | SA2 | 239 | PD1 |
| 30 | NC | 150 | NC | 60 | VIN | 180 | NC | 90 | NC | 210 | NC | 120 | NC | 240 | NC |

FIG. 14     *Card Edge Pinout - Partial Support for Module*

Card Edge Interface Signal Descriptions

| SYMBOL | TYPE | DESCRIPTION |
|---|---|---|
| PD0, PD1 | - | Presence detect pins for systems supporting module hotswap operations. These will both be connected to Vss when the module is fully populated. |
| RSVD | - | These pins are reserved for future use. Do not connect. |
| NC | - | These pins are not to be connected in designs that are not purposed for dual-use of DDR3 DRAM modules and hybrid memory/storage module. DDR3 signals should be appropriately connected for systems supporting both types of modules in the same sockets. |
| Vin | POWER | Supply Voltage for the hybrid memory/storage module. |
| Vss | POWER | Supply Return voltage rail for the hybrid memory/storage module. |
| SA [2:0] | IN | These signals are tied at the system planar to either VSS or VDDSPD to configure the serial SPD EEPROM address range. |
| SDA | I/O | This bi-directional pin is used to transfer data into or out of the module SMBus interface. A resistor is connected from the SDA bus line to VDDSPD on the system planar to act as a pull-up. |
| SCL | IN | This signal is used to clock data into and out of the module SMBus interface. A resistor may be connected from the SCL bus time to VDDSPD on the system planar to act as a pull-up. |
| VDDSPD | POWER | Serial EEPROM positive power supply (wired to a separate power pin at the connector which supports from 2.7 Volt to 3.6 Volt (nominal 3.3 Volt) operations.<br><br>The SPD EEPROM may be driven on an auxiliary or continuous power source that is supplied when the main VIN system power source is off. However, the module should not be inserted in the socket while power is being supplied to the VDDSPD pin. The module SMBus interface will not be available when only VDDSPD is supplied. |
| EVENT_n | OUT (open drain) | This signal indicates that a thermal event has been detected in the thermal sensing device. |

FIG. 15

Serial ATA Interface Pin Signal Definitions

| Pin | Function | Definition |
|---|---|---|
| S1 | SGND_1 | Signal Ground |
| S2 | SATA0_rx_t | RX Differential Signal + |
| S3 | SATA0_rx_c | RX Differential Signal - |
| S4 | SGND_2 | Signal Ground |
| S5 | SATA0_tx_c | TX Differential Signal - |
| S6 | SATA0_tx_t | TX Differential Signal + |
| S7 | SGND_3 | Signal Ground |

FIG. 16

| Pin | Front Side | Pin | Back Side | Pin | Front Side | Pin | Back Side | Pin | Front Side | Pin | Back Side | Pin | Front Side | Pin | Back Side |
|---|---|---|---|---|---|---|---|---|---|---|---|---|---|---|---|
| 1 | NC | 121 | VSS | 31 | NC | 151 | VSS | 61 | NC | 181 | NC | 91 | NC | 211 | VSS |
| 2 | PD0 | 122 | NC | 32 | VSS | 152 | NC | 62 | VIN | 182 | VIN | 92 | VSS | 212 | NC |
| 3 | NC | 123 | NC | 33 | NC | 153 | NC | 63 | SATA0_tx_t | 183 | VIN | 93 | NC | 213 | NC |
| 4 | NC | 124 | VSS | 34 | NC | 154 | VSS | 64 | SATA0_tx_c | 184 | SATA0_rx_t | 94 | NC | 214 | VSS |
| 5 | VSS | 125 | NC | 35 | VSS | 155 | NC | 65 | VIN | 185 | SATA0_rx_c | 95 | VSS | 215 | NC |
| 6 | NC | 126 | NC | 36 | NC | 156 | NC | 66 | VIN | 186 | VIN | 96 | NC | 216 | NC |
| 7 | NC | 127 | VSS | 37 | NC | 157 | VSS | 67 | NC | 187 | EVENT_n | 97 | NC | 217 | VSS |
| 8 | VSS | 128 | NC | 38 | VSS | 158 | NC | 68 | NC | 188 | NC | 98 | VSS | 218 | NC |
| 9 | NC | 129 | NC | 39 | NC | 159 | NC | 69 | VIN | 189 | VIN | 99 | NC | 219 | NC |
| 10 | NC | 130 | VSS | 40 | NC | 160 | VSS | 70 | NC | 190 | NC | 100 | NC | 220 | VSS |
| 11 | VSS | 131 | NC | 41 | VSS | 161 | RSVD | 71 | NC | 191 | VIN | 101 | VSS | 221 | NC |
| 12 | NC | 132 | NC | 42 | RSVD | 162 | RSVD | 72 | VIN | 192 | NC | 102 | NC | 222 | NC |
| 13 | NC | 133 | VSS | 43 | RSVD | 163 | VSS | 73 | NC | 193 | NC | 103 | NC | 223 | VSS |
| 14 | VSS | 134 | NC | 44 | VSS | 164 | NC | 74 | NC | 194 | VIN | 104 | VSS | 224 | NC |
| 15 | NC | 135 | NC | 45 | NC | 165 | NC | 75 | VIN | 195 | NC | 105 | NC | 225 | NC |
| 16 | NC | 136 | VSS | 46 | NC | 166 | VSS | 76 | NC | 196 | NC | 106 | NC | 226 | VSS |
| 17 | VSS | 137 | NC | 47 | VSS | 167 | RSVD | 77 | NC | 197 | VIN | 107 | VSS | 227 | NC |
| 18 | NC | 138 | NC | 48 | NC | 168 | NC | 78 | VIN | 198 | NC | 108 | NC | 228 | NC |
| 19 | NC | 139 | VSS | 49 | NC | 169 | NC | 79 | NC | 199 | VSS | 109 | NC | 229 | VSS |
| 20 | VSS | 140 | NC | 50 | NC | 170 | VIN | 80 | VSS | 200 | NC | 110 | VSS | 230 | NC |
| 21 | NC | 141 | NC | 51 | VIN | 171 | NC | 81 | NC | 201 | NC | 111 | NC | 231 | NC |
| 22 | NC | 142 | VSS | 52 | NC | 172 | NC | 82 | NC | 202 | VSS | 112 | NC | 232 | RSVD |
| 23 | VSS | 143 | NC | 53 | NC | 173 | VIN | 83 | VSS | 203 | NC | 113 | VSS | 233 | NC |
| 24 | NC | 144 | NC | 54 | VIN | 174 | NC | 84 | NC | 204 | NC | 114 | NC | 234 | NC |
| 25 | NC | 145 | VSS | 55 | NC | 175 | NC | 85 | NC | 205 | VSS | 115 | NC | 235 | VSS |
| 26 | VSS | 146 | NC | 56 | NC | 176 | VIN | 86 | VSS | 206 | NC | 116 | VSS | 236 | VDDSPD |
| 27 | NC | 147 | NC | 57 | VIN | 177 | NC | 87 | NC | 207 | NC | 117 | SA0 | 237 | SA1 |
| 28 | NC | 148 | VSS | 58 | NC | 178 | NC | 88 | NC | 208 | VSS | 118 | SCL | 238 | SDA |
| 29 | VSS | 149 | NC | 59 | NC | 179 | VIN | 89 | VSS | 209 | NC | 119 | SA2 | 239 | PDI |
| 30 | NC | 150 | NC | 60 | VIN | 180 | NC | 90 | NC | 210 | NC | 120 | NC | 240 | NC |

FIG. 17  *Card Edge Pinout - Full Support for Incompatible Memory Modules*

Card Edge Interface Signal Descriptions

| SATA0_tx_t | OUT | True (Positive) signal of SATA Transmit Differential Pair |
|---|---|---|
| SATA0_tx_c | OUT | Complement (Negative) signal of SATA Transmit Differential Pair |
| SATA0_rx_t | IN | True (Positive) signal of SATA Receive Differential Pair |
| SATA0_rx_c | IN | Complement (Negative) signal of SATA Receive Differential Pair |
| PD0, PD1 | - | Presence detect pins for systems supporting module hotswap operations. These will both be connected to Vss when the module is fully populated. |
| RSVD | - | These pins are reserved for future use. Do not connect. |
| NC | - | These pins are not to be connected in designs that are not purposed for dual-use of DDR3 DRAM modules and Viking SATADIMM'. DDR3 signals should be appropriately connected for systems supporting both types of modules in the same sockets. |
| Vin | POWER | Supply Voltage for the module |
| Vss | POWER | Supply Return voltage rail for the module |
| SA [2:0] | IN | These signals are tied at the system planar to either VSS or VDDSPD to configure the serial SPD EEPROM address range. |
| SDA | I/O | This bi-directional pin is used to transfer data into or out of the module SMBus interface. A resistor must be connected from the SDA bus line to VDDSPD on the system planar to act as a pull-up. |
| SCL | IN | This signal is used to clock data into and out of the module SMBus interface. A resistor may be connected from the SCL bus time to VDDSPD on the system planar to act as a pull-up. |
| VDDSPD | POWER | Serial EEPROM positive power supply (wired to a separate power pin at the connector which supports from 2.7 Volt to 3.6 Volt (nominal 3.3 Volt) operations.<br><br>The SPD EEPROM may be driven on an auxiliary or continuous power source that is supplied when the main VIN system power source is off. However, the module should not be inserted in the socket while power is being supplied to the VDDSPD pin. The module SMBus interface will not be available when only VDDSPD is supplied. |
| EVENT_n | OUT (open drain) | This signal indicates that a thermal event has been detected in the thermal sensing device. |

FIG. 18

METHOD AND APPARATUS FOR SUPPORTING STORAGE MODULES IN STANDARD MEMORY AND/OR HYBRID MEMORY BUS ARCHITECTURES

CLAIM OF PRIORITY UNDER 35 U.S.C. §119

The present Application for Patent claims priority to U.S. Provisional Application No. 61/288,548 entitled "Memory Technologies", filed Dec. 21, 2009, U.S. Provisional Application No. 61/381,004 entitled "Improvements to Memory Technologies", filed Sep. 8, 2010, and U.S. Provisional Application No. 61/424,672 entitled "Method And Apparatus For Supporting Storage Modules In Standard Memory And/Or Hybrid Memory Bus Architectures", filed Dec. 19, 2010, all of which are assigned to the assignee hereof and hereby expressly incorporated by reference herein.

FIELD

Various features relate to improvements to memory modules, memory architectures, and memory controllers. More particularly, at least one aspect provides for reusing standard memory module interfaces and/or hybrid memory bus architectures to support previously incompatible solid state drive memory/storage modules.

BACKGROUND

Computers and computer systems, such as enterprise servers, house many electronic devices, such as circuit boards, processors, memory devices, power supplies, and cooling fans, within a limited amount of space so spare inner space is generally minimal. As a result, in the limited spare space that does exist, tradeoffs have to be made based on the dimensions of various devices.

Various existing and new enterprise servers make use of high speed, volatile memory (e.g., dynamic random access memory (DRAM)) to hold operating instructions and data. Increasingly, these servers are also including large amounts of relatively inexpensive non-volatile memory devices, such as NAND flash memory, to store applications and/or data. However, many existing DRAM-based computer or servers are designed without the appropriate bus interfaces to support non-volatile (e.g., NAND flash) memory either directly or through storage bus interfaces such as SATA and SAS. Supporting such non-volatile memory devices may involve a costly and lengthy redesign of the computer or server. Similarly, most systems employing non-volatile memory devices cannot simply add volatile memory devices, e.g., due to different bus requirements, voltages, signaling, etc. As a result, significant changes to a computer or server physical architecture are needed to add non-volatile memory devices into an updated model of what was previously a volatile memory-based system and vice-versa. This is further complicated due to the limited space (e.g., motherboard surface space) need for additional components or devices so it is not always possible to merely add additional memory modules.

Moreover, in many instances it is undesirable to replace computers or servers (or their components such as a motherboard) due to cost considerations, downtime, and/or other factors. Thus, any solution that adds non-volatile memory devices should preferably provide backward compatibility for legacy or existing computer or server systems.

In view of the above, increasing the capacity and storage performance of existing servers, storage or cloud computing solutions, as well as designing faster and more efficient enterprise server and storage solutions has been difficult, if not impossible. Consequently, a method and apparatus is needed that allows users to significantly increase the capacity and storage performance of existing servers, storage or cloud computing solutions as well allowing for new designs that are no longer constrained by standard hard drive space requirements.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to a first example, a memory module is provided comprising: (a) a circuit board, (b) a plurality of non-volatile memory devices coupled to at least one side of the circuit board, (c) a first interface for coupling to a host memory bus and providing power to the plurality of non-volatile memory devices, and/or (d) a second interface for coupling to a secondary controller different from a primary host controller for the host memory bus. In one implementation, the first interface may be a card edge interface adapted to couple to a socket for the host memory bus and the second interface may be a socket adapted to receive a cable connector. The memory module may be accessible via the secondary controller while volatile memory modules coupled to the host memory bus are concurrently accessible via the host memory bus. The second interface may carry data traffic to and from the plurality non-volatile memory devices. For instance, the second interface may provide at least one serial communication path for accessing the plurality of non-volatile memory devices. In one example, the second interface may provide: (a) a first serial communication path for receiving data for the plurality of non-volatile memory devices and/or (b) a second serial communication path for transmission of data from the plurality of non-volatile memory devices. In one implementation, the primary host memory controller may be a double-data-rate three (DDR3)-compatible memory controller and the secondary controller may be a Serial Advanced Technology Attachment (SATA)-compatible controller. In another implementation, the primary host memory controller may be a double-data-rate three (DDR3)-compatible memory controller and the secondary controller may be a Serial Attached Small Computer System Interface (SAS)-compatible controller.

The memory module may also comprise a solid state drive controller coupled to the second interface and the plurality of non-volatile memory devices. The solid state drive controller may be adapted to facilitate communications to and from the plurality of non-volatile memory devices over the second interface.

The memory module may also comprise a power supply adapted to obtain a first voltage from the first interface and convert the first voltage to a second voltage to power the plurality of non-volatile memory devices. The power supply may be provided at least partially on a removable daughter card that couples to the memory module. A level for the second voltage may be adaptable by using different daughter cards.

The memory module may also comprise a thermal sensor adapted to obtain a temperature for the memory module and send an event signal via the first interface if the temperature exceeds a threshold.

The memory module may also comprise a read-only memory device for storing information identifying the memory module, wherein the memory module is adapted to provide such information through the first interface to a host the host memory bus.

While the memory module may be provided in different physical dimensions, it may have a height, width, and length dimensions that complies with a specification for all memory modules to be coupled to the host memory bus.

The memory module may also be adapted to selectively send and receive data traffic for the plurality non-volatile memory devices through the second interface or the first interface, depending on which of the two interfaces is coupled to a communication path compatible with data transmissions and reception of the memory module. The communication path may be a differential pair that carry the data traffic in series. When the first interface is used for data traffic by the memory module, at least one pair of differential clock pairs of the host memory bus are repurposed for transmission of the data traffic.

In another example, a non-volatile memory module is provided comprising: (a) a circuit board, (b) a plurality of non-volatile memory devices coupled to at least one side of the circuit board, and/or (c) a bus interface for coupling the non-volatile memory module to a host memory bus that concurrently supports a volatile memory module. The bus interface for the non-volatile memory module may use an unshared differential pair of electrical paths over the host memory bus for data traffic while the volatile memory module may use electrical paths on the host memory bus that are shared among a plurality of volatile memory modules for data traffic. The unshared differential pair of electrical paths may be a repurposed differential clock pair from the host memory bus. Concurrent support of the volatile memory module includes providing simultaneous access to the non-volatile memory module and the volatile memory module over the host memory bus. The non-volatile memory module may also comprise a solid state drive controller coupled to the plurality of non-volatile memory devices, the solid state drive controller adapted to facilitate communications to and from the plurality of non-volatile memory devices over the bus interface.

The host memory bus may have a first data throughput capacity for data traffic to the volatile memory module. However, repurposing the differential clock pair for data traffic for the non-volatile memory module effectively increases the data throughput capacity of the host memory bus to a second data throughput capacity.

In an alternative mode of operation, the host memory bus may provide power to the plurality of non-volatile memory devices through the bus interface. The memory module may include a second interface for coupling to a secondary controller different from a primary host controller for the host memory bus. The non-volatile memory module may be adapted to selectively send and receive data traffic for the plurality non-volatile memory devices through the second interface or the bus interface, depending on which of the two interfaces is coupled to a communication path compatible with data transmissions and reception of the non-volatile memory module.

The memory module may also include one or more sockets coupled to the circuit board, the one or more sockets for accepting a daughter card adapted to convert a first voltage obtained from the host memory bus to a second voltage used by the plurality of non-volatile memory devices.

In yet another example, a memory module is provided that comprises: (a) a circuit board, (b) a plurality of memory devices coupled to at least one side of the circuit board, (c) a controller coupled to the plurality of memory devices and adapted to send and receive data traffic, and/or (d) a bus interface for coupling the memory module to a host memory bus, wherein the controller sends and receives the data traffic serially over non-data signal paths of the host memory bus. The controller may be configured to ignore a plurality of data signal paths defined for data traffic by the host memory bus. The host memory bus may implement such data signal paths as parallel signal paths for data traffic transmission and reception.

BRIEF DESCRIPTION OF THE DRAWINGS

FIGS. 14, 15, and 16 define an exemplary pinout specification for a memory/storage module that includes a first edge interface adapted to plug into a receiving socket for a DDR-compatible memory bus while utilizing a different interface for data traffic communications over a SATA-compatible bus.

FIGS. 17 and 18 illustrate pinouts for an exemplary DDR3 interface that may be reused or repurposed by a SATA memory module.

DETAILED DESCRIPTION

Figure 1A:
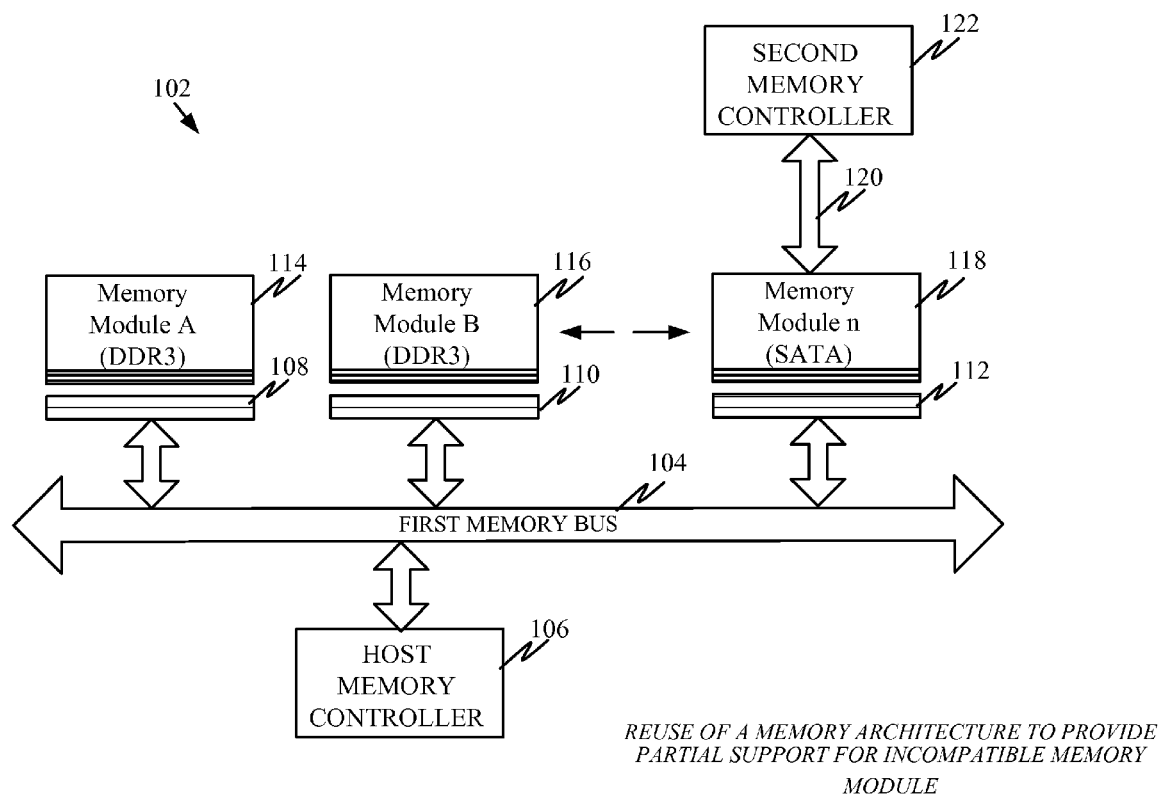
FIG. 1A illustrates an example of a host memory bus which can support at least partial operation of a previously incompatible memory module.

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Overview

A first feature provides a non-volatile memory/storage module that is adapted to partially reuse or repurpose a first memory architecture originally specified for distinct memory modules. For example, the first memory bus architecture may be originally specified for volatile memory modules (e.g., double-data-rate (DDR) memory modules) but may be reused to at least partially support the non-volatile memory/storage modules (e.g., utilizing non-volatile flash storage devices or configured as a solid state drive (SSD)) that are traditionally incompatible with respect to the electrical characteristics of the first memory bus architecture (e.g., data bus signaling). For instance, while the first memory bus architecture may be compatible with volatile memory modules (DDR3 memory devices) which utilize a common or shared memory bus (e.g., parallel data bus), the non-volatile memory/storage modules may be compatible with serial data transmissions (e.g., serial data bus such as Serial Advanced Technology Attachment (SATA) or Serial Attached Serial Attached Small Computer System Interface (SCSI) (SAS)). In one example, the non-volatile memory/storage modules may include a first interface (e.g., edge connector) that is physically compatible with a receiving socket for the first memory bus architecture but is at least partially incompatible with the electrical characteristics and/or signaling for the first memory bus architecture (e.g., uses serial data transmissions rather than parallel data transmissions). The non-volatile memory module may utilize some (but not necessarily all) of the electrical connections from the socket to obtain power, ground, etc., with which to provide power to non-volatile memory/storage devices on the non-volatile memory/storage modules. In some implementations, the non-volatile memory/storage module may either reuse the first interface or a second interface for data traffic (e.g., transmission and/or reception). For instance, the second interface may be a connector through which the non-volatile memory/storage module can be coupled to a different bus for receiving and/or transmitting data. By reusing the existing first memory architecture, additional (incompatible) memory or storage modules (e.g., the non-volatile memory/storage module) may be added to a system without the need to replace a motherboard. In one example, the non-volatile memory/storage module may comply with the physical dimensions of modules specified for the first memory bus architecture (e.g., host memory bus) and the first interface may be an edge connector that can be inserted into a standard DDR socket for a host memory bus (e.g., to obtain power and ground). This approach reuses the first memory bus architecture to provide support for previously incompatible memory/storage modules and expand support for mixed memory modules. Thus, spare memory slots on an existing computing system may be reused to receive and partially support distinct memory/storage modules. Note that the features, function, and/or approaches described herein may be used with other previously incompatible memory modules, not just non-volatile memory/storage modules.

A second feature provides a detachable daughter card coupled to the memory module for converting a memory bus voltage to a second voltage for memory devices on the non-volatile memory/storage module. That is, the voltage provided by a host memory bus may be incompatible with the voltage expected by non-volatile (flash) memory devices of the non-volatile memory/storage module. In some instances, power/voltage conversion may be performed by components mounted directly on the circuit board for the non-volatile memory/storage module. However, due to surface space limitations, ease of configuration, and/or compliance with standard memory module physical sizes, a non-volatile memory/storage module may not be able to provide the necessary power/voltage conversion on the module itself. Therefore, a daughter card may be provided that mounts directly to the non-volatile memory/storage module and is adapted to convert a first voltage level (e.g., obtained from the host memory bus) to second voltage level (used by non-volatile devices mounted to the non-volatile memory/storage module).

A third feature provides a first memory bus architecture on a host system (e.g., motherboard, computer, server, etc.) that can support different types of at least partially incompatible memory/storage modules (e.g., DDR-compatible memory modules and SATA/SAS-compatible memory modules) using the same memory bus. In some implementations, the first memory bus architecture may permit concurrent installation and use of incompatible memory modules. For example, the certain socket-specific electrical paths on the first memory bus architecture may be adaptively repurposed for non-volatile memory/storage modules or volatile memory modules depending on which type of module is connected to each socket of the host memory bus. For example, a differential pair of electrical paths may be used for a clock signal when a volatile memory module is coupled to a socket, but may be used for serial data traffic (e.g., transmission or reception) when a non-volatile memory module is coupled to the same socket. Note that the host memory bus may use a shared data bus (i.e., different electrical paths from the differential pair) for data traffic to/from volatile memory modules. Thus, the volatile memory modules and non-volatile memory modules may be accessed concurrently. As a result, the throughput data capacity of the host memory bus is expanded. Additionally, because the differential pair electrical paths are specific to each socket, a plurality of non-volatile memory modules may be accessed concurrently over the host memory bus.

A fourth feature provides a hybrid memory controller that manages signaling and traffic to and from memory modules coupled to a host memory bus. The hybrid memory module may be adapted to recognize different types of memory modules coupled to the host memory bus and repurposes/reuses one or more electrical paths on the host memory bus for different purposes. For example, where the hybrid memory module recognizes that a first type of memory module (e.g., volatile memory module) is coupled to a particular socket of the host memory bus, then a differential pair of electrical paths may be used for a clock signal. However, if the hybrid memory module recognizes that a second type of memory module (e.g., non-volatile memory module) is coupled to the same socket of the host memory bus, then the differential pair of electrical paths may be used for a differential data traffic signal.

Two configurations are described herein for purposes of illustrating how non-volatile memory/storage modules may be coupled to a host memory bus that typically accepts volatile memory modules. In a first configuration (Configuration A), a non-volatile memory/storage module may obtain physical support and power from a first memory bus but performs data communications (e.g., send/receive data traffic) over a second memory bus. This first configuration is particularly useful in accommodating installation of the non-volatile memory/storage module on a legacy system where the host memory controller is not designed to facilitate data traffic to/from the non-volatile memory/storage module. In a second configuration (Configuration B), a non-volatile memory/storage module may obtain complete support (i.e., physical support, power, and data traffic) from a hybrid memory bus. In this second configuration, certain electrical paths on the hybrid memory bus may be dynamically or selectively repurposed for different types of signals depending on whether a volatile or non-volatile memory module is coupled to a socket of the hybrid memory bus.

Configuration A—Memory Modules Partially Reusing Host Memory Bus

FIG. 1A illustrates an example of a host memory bus which can support at least partial operation of a previously incompatible memory module. A memory bus architecture 102 is provided comprising a first (primary) memory bus 104, a host (primary) memory controller 106 coupled to the first memory bus 104, and a plurality of memory module sockets 108, 110, and 112 coupled to the first memory bus 104. In this example, the first memory bus 104 operates according to the electrical and/or signaling specification for a first type of memory module (e.g., DDR3-compatible memory module). The sockets 108, 110, and 112 may also be identical to each other (e.g., having the same physical dimensions and/or electrical characteristics). In one example, the memory bus 104 and sockets 108, 110, and 112 may operate according to the specification for a first type of memory module (e.g., a DDR3 (double data rate) module).

The sockets 108, 110, and 112 may be adapted receive removable memory modules (e.g., dual inline memory modules (DIMM)). In one example, some sockets 108 and 110 may receive a first type of memory module 114 and 116 (e.g., volatile memory module such as DDR3-compatible DIMM) while one or more sockets 112 may receive a second type of memory module 118 (i.e., a non-volatile memory/storage module). The signaling specification for the first type of module is different from the signaling specification for the second type of module. However, the physical dimensions of the second type of memory module 118 may be compatible with the socket 112, thus allowing insertion of the second type of memory module into the socket 112.

In one example, the second type of memory module 118 may be a non-volatile memory/storage module that includes a first interface (e.g., edge connector) that is physically (dimensionally) compatible with the socket 112 but partially incompatible with the electrical characteristics and/or signaling (e.g., different data bus) for the first type of memory module. The non-volatile memory/storage module 118 may utilize some (but not necessarily all) of the electrical connections from the socket 112 to obtain power, ground, etc., with which to provide power to non-volatile memory/storage devices on the second type of memory module 118. However, the second type of memory module 118 may include a second interface through which it can be coupled to a second bus 120 for receiving and/or transmitting data traffic (e.g., data content and/or address information) from a second memory controller 122.

Figure 1B:
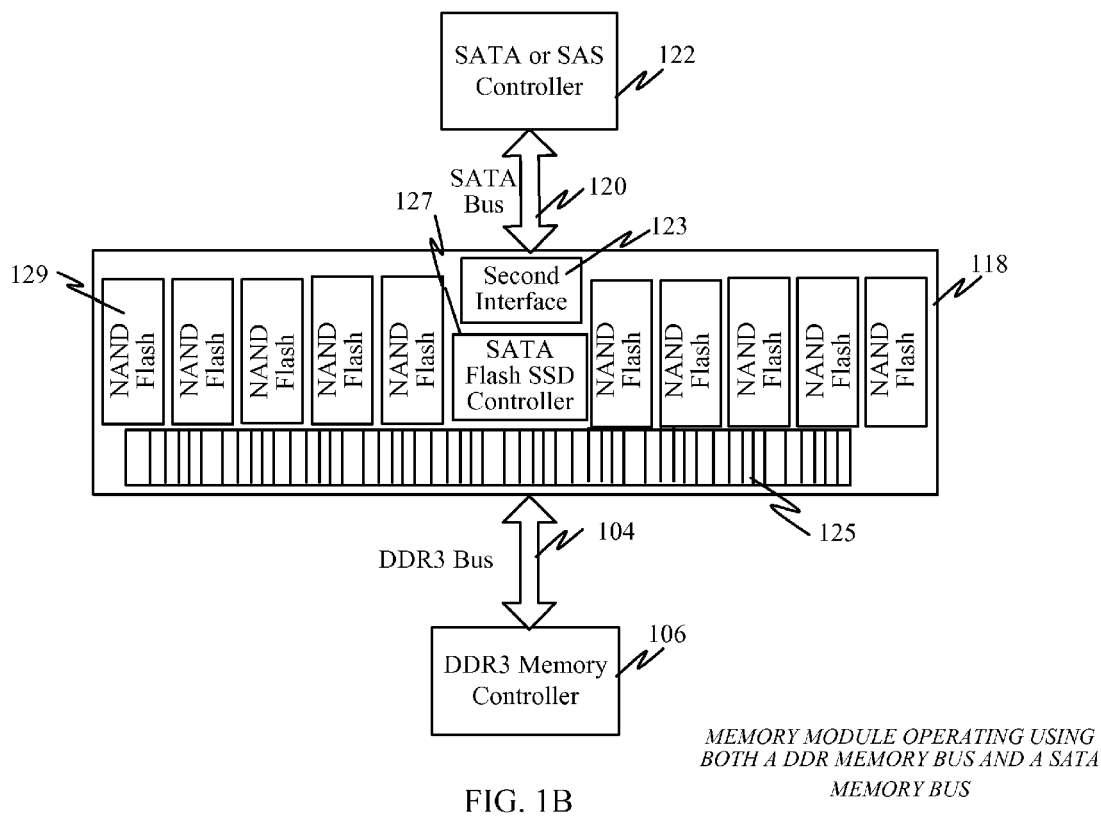
FIG. 1B further illustrates an example of non-volatile memory/storage module adapted to operate using both a DDR memory bus and a SATA memory bus.

FIG. 1B further illustrates an example of non-volatile memory/storage module adapted to operate using both a DDR memory bus and a SATA memory bus. This is one example of the memory architecture of FIG. 1A. Here, the first memory bus 104 may be a DDR3-compatible bus and the host memory controller 106 may be a DDR-compatible memory controller. The second memory bus 120 may be a SATA/SAS-compatible bus and the second memory controller 122 may be SATA/SAS-compatible controller. The second type of memory module 118 is herein referred to as a non-volatile memory/storage module. The non-volatile memory/storage module may include a plurality of non-volatile memory/storage devices. The non-volatile memory/storage module may obtain power and/or ground from the DDR3-compatible bus (first memory bus 104) while sending/receiving data traffic through its second interface 123 via the SATA/SAS-compatible bus (second memory bus 120).

In some implementations, the non-volatile memory/storage module may be adapted to only receive/transmit data over the second interface 123. For example, this may be the case with legacy or existing memory buses and/or host memory controllers that are not adapted to communicate with both volatile and non-volatile memory modules. Hence, the non-volatile memory module may operate without support from the host memory controller (e.g., controller 106).

In other implementations (described further as Configuration B), the non-volatile memory/storage module may auto-detect whether its edge interface 125 is coupled to a bus that is SATA/SAS-compatible. Such determination may be based on whether certain clocks, signals, and/or strobes are detected at particular pins of the edge interface 125. If the bus is SATA/SAS-compatible, then the non-volatile memory/storage module sends/receives data traffic through its edge interface 125. Otherwise, the non-volatile memory/storage module uses its second interface 123 to send/receive data traffic. The non-volatile memory/storage module 118 may also include a controller 127 (e.g., SATA Flash Solid State Drive Controller) that may be configured to read/write data from/to a plurality of non-volatile memory devices 129 and send/receive the data over the second bus 120.

Configuration B—Memory Modules Fully Reusing a Host Memory Bus

Another feature provides a hybrid memory bus where memory modules of traditionally incompatible signaling may co-exist and operate. For example, the hybrid memory bus may allow both non-volatile memory/storage modules and volatile memory modules to operate concurrently.

Figure 2:
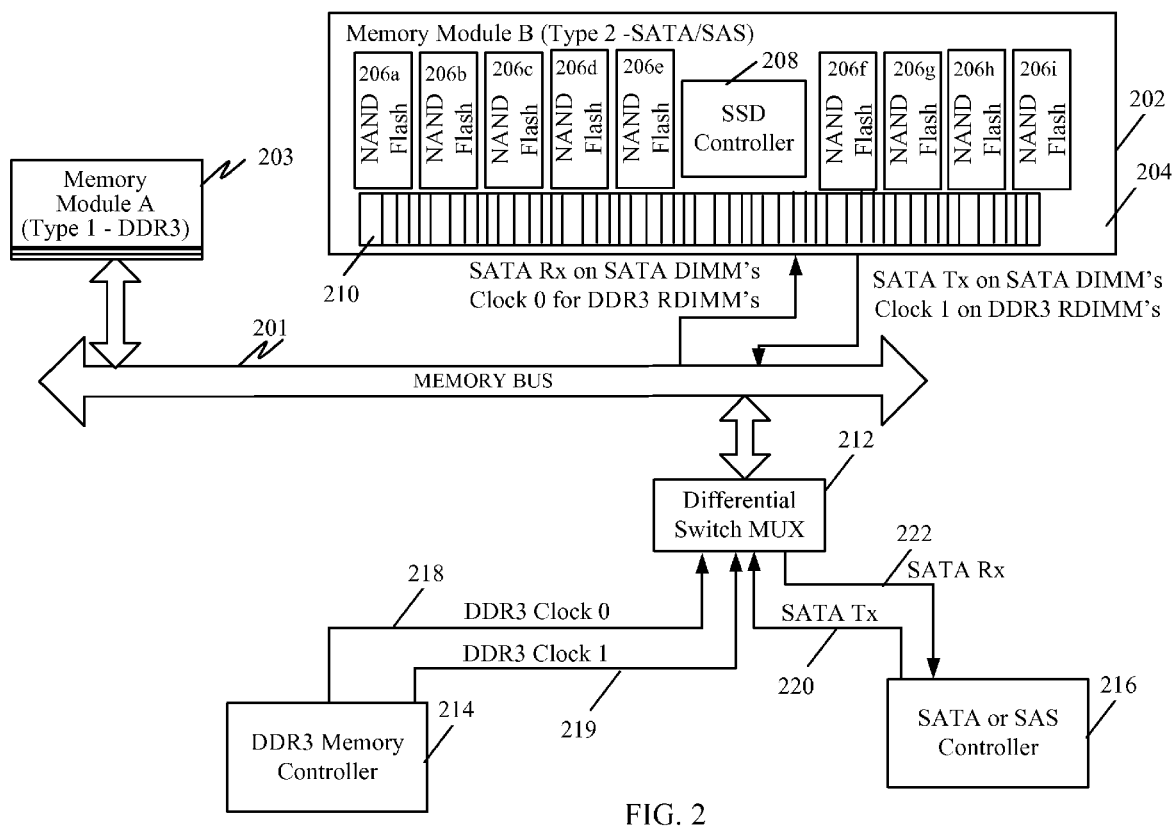
FIG. 2 illustrates an example of a hybrid host memory bus architecture which can concurrently support operation of incompatible memory modules.

FIG. 2 illustrates an example of a hybrid host memory bus architecture 200 which can concurrently support operation of incompatible memory modules. This configuration may be possible or feasible when at least two differential clock pairs are available for each socket of a host memory bus. This may be the case, for example, when the host system is adapted to support both registered dual in-line memory modules (RDIMM) and un-buffered dual in-line memory modules (UDIMM) since two differential clock pairs are used for each socket on the host memory bus.

In this example, the host memory bus 201 may be shared among a memory module A 203 (of a first memory type, e.g., volatile memory modules using DDR3-compatible data communications) and a memory module B 202 (of a second memory type, e.g., non-volatile memory module using SATA/SAS-compatible data communications). To enable operation of memory module B 202 over a DDR3-compatible socket and host memory bus 201, a high-speed differential pair switch 212 may be used to switch between a SATA data path 220/222 (i.e., transmit/receive differential pairs) and DDR3 clock path 218/219 (e.g., differential clock pairs). The host system may simply determine the type of memory module installed (e.g., DDR3-compatible DIMM module or a SATA/SAS-compatible DIMM module) and control the switch 212 to connect the memory bus 201 to the appropriate controller (i.e., DDR3-compatible controller 214 or SATA/SAS-compatible controller 216). The host system may determine what type of memory module is installed at a particular socket of the memory bus 201 by querying the memory module. The host system can then use this information to configure the differential switch 212. In one example, the host memory bus architecture 200 may utilize two dedicated clocks to each socket of the memory bus 201. These dedicated clocks may be used by volatile memory modules. Each clock may be transmitted as a differential pair over two electrical paths to the socket. Thus, these two differential clock electrical paths can be repurposed for serial data traffic for non-volatile memory modules. In one example, a first differential clock pair is repurposed for differential serial data transmissions while a second differential clock pair is repurposed for differential serial data reception.

In one implementation, the differential switch 212 switches between the differential clock pairs (i.e., Clock 0 and Clock 1) of the DDR3 memory controller 214 and the transmit/receive differential SATA pairs 220 and 222 of the SATA/SAS memory controller 216. As shown, the DDR3 memory controller 214 may provide a first clock signal (DDR3 Clock 0) 218 to a first input of a first port of the multiplexer 212 and a second clock signal (DDR3 Clock 1) 219 to a first input of a second port of the multiplexer 212. Similarly, the SATA Tx differential signal pair 220 may be provided to a second input of the first port of the multiplexer 212 and the SATA Rx differential signal pair 222 may be provided to a second input of the second port. When the SATA/SAS controller 216 is selected, then the SATA Tx 220 and SATA Rx 222 are passed to the memory bus 201. Otherwise, when the DDR3 memory controller 214 is selected, the DDR clocks 218 and 219 are passed to the memory bus 201. In this example, one dual-ported differential switch may be used for each DIMM socket that is to be enabled.

This configuration may facilitate concurrent communications over the host memory bus 201 for memory modules of different types. For example, a memory module A 203 (e.g., DDR3 DRAM module) can communicate with the DDR3-compatible memory controller 214 on the host memory bus 201 while the memory module B 202 concurrently communicates to the SATA/SAS controller 216 over the host memory bus 201. In fact, because the different clock pairs are specific to each socket, a plurality of memory modules B 202 and one memory module A 203 may communicate over the memory bus concurrently.

In one example, the memory module B 202 may include a circuit board 204 having a plurality of non-volatile memory devices 206a-206i, such as NAND flash devices, and a SATA Flash SSD controller 208 mounted thereon. The circuit board 204 may include an edge connector 210 having a plurality of electrical interconnects to couple the memory module B 202 to the memory bus 201. In this example, the memory bus 201 may be coupled to a dual-port, two-input, single output differential multiplexer 212 that detects the type of memory module coupled to the memory bus 201 and electrically couples the memory bus 201 to a corresponding memory controller (e.g., DDR3-compatible memory controller 214 or SATA/SAS-compatible memory controller 216).

In other implementations, a single host memory controller may incorporate the capability and/or functionality to communicate with both types of memory modules (e.g., DDR3-compatible modules and SATA/SAS-compatible modules). Thus, the functions performed by the switch 212, SATA/SAS controller 216, and/or DDR3 memory controller 214 may be combined into a single host memory controller.

Figure 3:
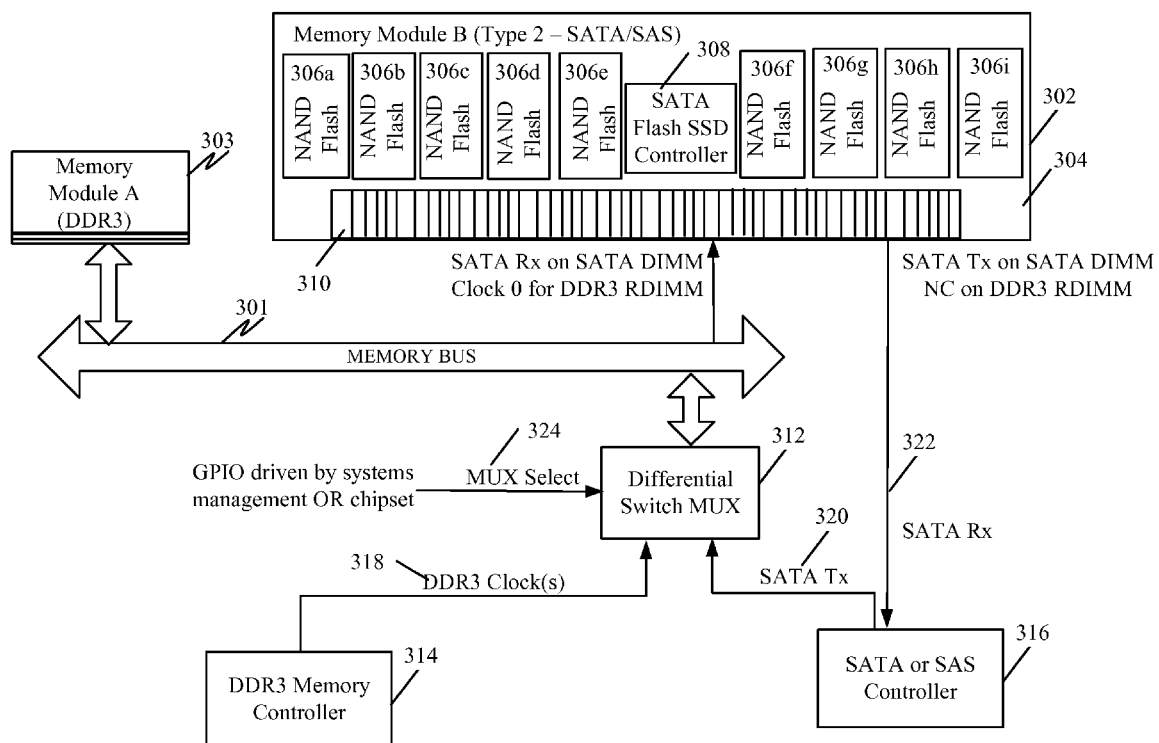
FIG. 3 illustrates another example of a host memory bus architecture which can concurrently support operation of incompatible memory modules in host systems.

FIG. 3 illustrates another example of a host memory bus architecture 300 which can concurrently support operation of incompatible memory modules in host systems. In this configuration, only a single clock pair may be available, such as when the host system supports only registered dual in-line memory modules (RDIMM). For instance, RDIMM's only need one differential pair clock since the clock is re-driven by a register/PLL logic device. Thus, because just a first differential pair is used for the RDIMM clock, there is no need to multiplex both differential pairs for data traffic. The second differential pair used for data traffic by some memory modules may simply be connected directly between the SATA/SAS controller to each socket.

In this example, a host system memory bus 301 may be shared among a memory module A 303 (of a first memory type, e.g., DDR3) and a memory module B 302 (of a second memory type, e.g., SATA). To enable operation of the SATA-compatible memory module B 302 over a DDR3 compatible socket and memory bus 301, a high-speed differential pair switch may be used to switch between a SATA signal link (i.e., transmit/receive differential pairs) and DDR3 clock differential pairs. The host system may simply determine the type of memory module installed (e.g., DDR3 DIMM or a SATA-compatible DIMM) and control the switch to connect the memory bus 301 to the appropriate controller (i.e., DDR3 controller 314 or SATA controller 316). The host system may determine what type of module is installed at a particular socket of the memory bus 301 by querying the memory module. For example, serial presence detect (SPD) is a mechanism by which information stored in an electrically erasable programmable read-only memory (EEPROM) chip (coupled to each memory module) provides the host system (e.g., basic input/output system (BIOS) or System Management Bus (SMBus)) one or more memory module characteristics or information (e.g., module model, version, size, data width, speed, and/or voltage). The host system can then use this information to configure the differential switch MUX 312 (e.g., to communicate with the DDR3 memory controller 314 or the SATA/SAS controller 316).

The memory bus 301 may be coupled to a two-input, single output differential multiplexer 312 that, based on the type of memory module coupled to a particular socket of the memory bus 301, electrically couples certain pins of that socket to a corresponding memory controller (e.g., DDR3 memory controller 314 or SATA/SAS memory controller 316). In this example, a single DDR3 differential pair clock path is provided to each socket on the memory bus 301. This differential pair clock path may be reused as a first data traffic path for the memory module B 302 (e.g., SATA/SAS memory module) one data transmission path. As shown, the DDR3 memory controller 314 may provide its clock signal (DDR3 Clock) 318 as a first input to the differential switch multiplexer 312 and the SATA Tx signal pair 320 may be provided as a second input to the differential switch multiplexer 312. To select between the DDR3 clock differential pair 318 and the SATA Tx differential signal pair 320, (i.e., to select between the DDR3 memory controller 314 and the SATA/SAS memory controller 316), a General Purpose Input/Output (GPIO) interface driven by the host system management or chipset may be provided. That is, a multiplexer select line 324 may be used by the host system to adjust the operation of the differential switch multiplexer 312. If the DDR3 memory controller 314 is selected, the clock signal (Clock 0) 318 for a DDR3 memory module may be provided over the memory bus 301 to each corresponding socket. Alternatively, if the SATA/SAS controller 316 is selected, the SATA Tx signal pair 320 is provided over the memory bus 301 to the corresponding socket. The SATA RX signal pair 322 may be connected directly over an independent signal path from each socket to the SATA/SAS controller 316. This independent path may be disconnected (NC) when the installed memory module is determined to be a DDR3-compatible memory module.

The memory module B 302 may include a circuit board 304 having a plurality of non-volatile memory devices 306a-306i, such as NAND flash devices, and a SATA Flash SSD controller 308 mounted thereon. The circuit board 304 may include an edge connector 310 having a plurality of electrical interconnects to couple the memory module 302 to a socket for the memory bus 301.

Figure 4:
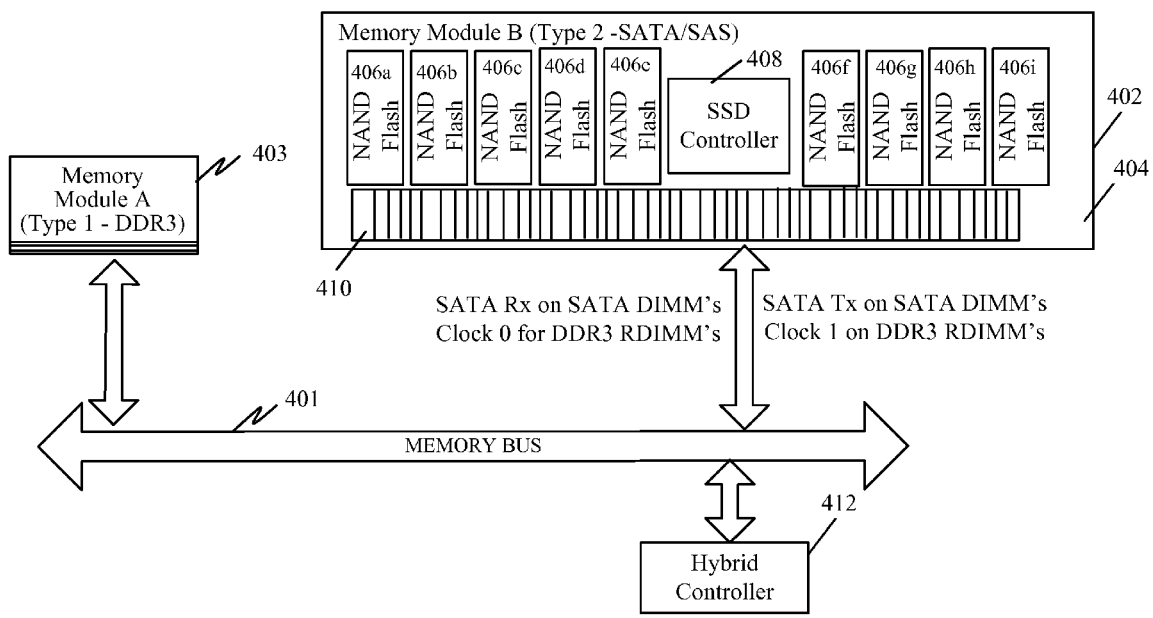
FIG. 4 illustrates another example of a hybrid host memory bus architecture which can concurrently support operation of incompatible memory modules.

FIG. 4 illustrates another example of a hybrid host memory bus architecture 400 which can concurrently support operation of incompatible memory modules. In this example, a single host memory controller 412 may incorporate the capability and/or functionality to communicate with two or more types of memory modules (e.g., memory module A 403 and memory module B 402).

Figure 5:
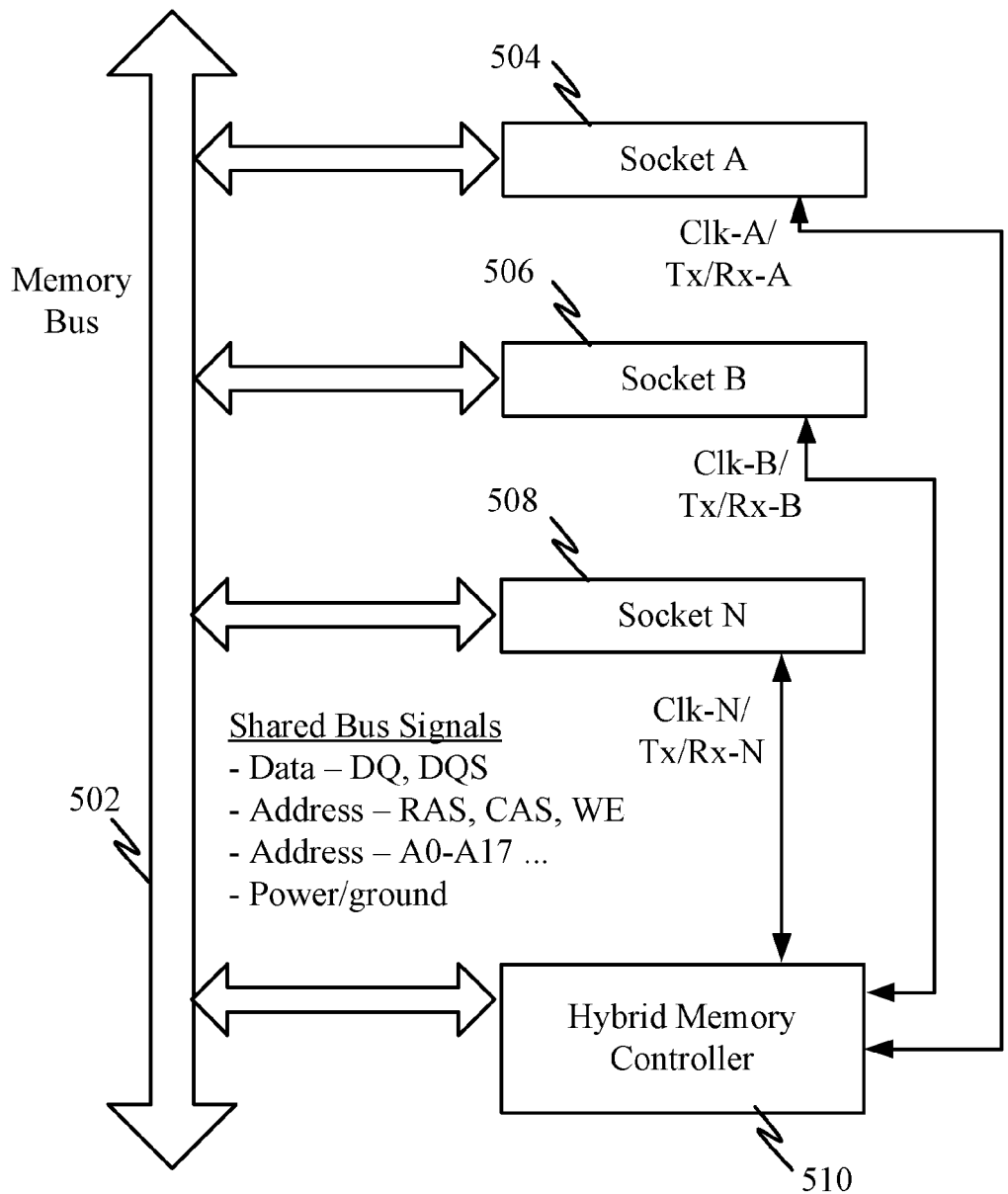
FIG. 5 illustrates an example of how a plurality of sockets for a hybrid host memory bus architecture may be coupled to a hybrid controller.

FIG. 5 illustrates an example of how a plurality of sockets for a hybrid host memory bus architecture may be coupled to a hybrid controller. Here, the plurality of sockets 504, 506, and 508 may be coupled to the memory bus 502 to obtain certain shared signals (e.g., data signal lines, address signal lines, command signal lines, power/ground, etc.). However certain signal lines may be coupled directly from the hybrid controller to each socket. For instance, one or more differential pair lines may be coupled directly between the hybrid controller 510 and the sockets 504, 506, and 508. Here the one or more differential pair lines may be used, in a first configuration, for one or more clocks signals, and, in a second configuration, for serial data transmit TX and receive RX signals.

Exemplary Hybrid Memory Bus Architecture

As illustrated in FIGS. 1A, 1B, 2, 3, 4 and 5, a memory bus architecture is provided having a memory bus with a plurality of identical module sockets. Each module socket may be capable of receiving either a non-volatile memory module or a volatile memory module. A memory controller may be coupled to the memory bus, where the memory controller is adapted to concurrently communicate with a non-volatile memory module and a volatile memory module via the memory bus. The memory controller may be adapted to repurpose at least one pair of electrical paths of the memory bus depending on whether a non-volatile memory module or a volatile memory module is coupled to a particular module socket. Such repurposing of at least one pair of electrical paths may include: (a) utilizing of the at least one pair of electrical paths for data traffic signals if a non-volatile memory module is coupled to the module socket; and/or (b) utilizing of the at least one pair of electrical paths for non-data traffic signals if a volatile memory module is coupled to the module socket. In one example, the non-data traffic signals may be clock signals. Additionally, the at least one pair of electrical paths of the memory bus may be independent for each module socket. The memory controller may be adapted to recognize whether a non-volatile memory module or a volatile memory module is coupled to a particular module socket. The memory controller may be adapted to transmit data traffic to a socket using serial transmissions if a non-volatile memory module is coupled to the socket, and may be adapted to transmit data traffic to the same socket using parallel transmissions if a volatile memory module is coupled to the socket. Additionally, the memory controller may be adapted to receive data traffic from a socket using serial transmissions if a non-volatile memory module is coupled to the socket, and may be adapted to receive data traffic from the same socket using parallel transmissions if a volatile memory module is coupled to the socket. In one example, the memory controller may be adapted to concurrently communicate data traffic to and from a plurality of sockets having non-volatile memory modules coupled thereto, while concurrently communicating data traffic to and from just one of the sockets having volatile memory modules coupled thereto.

In one implementation, the memory controller may be adapted to communicate with volatile memory modules using double-data-rate three (DDR3)-compatible signaling and to communicate with non-volatile memory modules using Serial Advanced Technology Attachment (SATA)-compatible signaling. In another implementation, the memory controller may be adapted to communicate with volatile memory modules using double-data-rate three (DDR3)-compatible signaling and to communicate with non-volatile memory modules using Serial Attached Small Computer System Interface (SAS)-compatible signaling.

Similarly, another memory bus architecture is provided comprising a memory bus including a plurality of electrical paths and at least one module socket, a first controller, a second controller, and/or a differential switch. The differential switch may be coupled between the memory bus and the first and second controllers. The differential switch may be adapted to dynamically switch a subset of the electrical paths for the memory bus between the first controller and second controller depending on a type of memory module coupled to the module socket.

In one example, the first controller may be a double-data-rate three (DDR3) memory controller and the second controller is a Serial Advanced Technology Attachment (SATA) memory controller. In one example, the first controller may be adapted to communicate with volatile memory modules while the second controller may be adapted to communicate with non-volatile memory modules.

In yet another example, the first controller may be adapted for data traffic communications using a shared common electrical path while the second controller may be adapted for data traffic communications over socket-specific electrical paths. The subset of the electrical paths may include a first pair of electrical paths used for a non-data signal by the first controller and a differential data traffic signal by the second controller.

In yet another example, the memory bus may include a plurality of module sockets, the subset of electrical paths being independent for each of the plurality of module sockets. Data traffic to and from a plurality of module sockets for the memory bus may be transmitted concurrently to the plurality of module sockets.

According to yet another feature, the first controller may be adapted to transmit data traffic to a socket using parallel transmissions if a volatile memory module is coupled to the module socket, and the second controller may be adapted to transmit data traffic to the same module socket using serial transmissions if a non-volatile memory module is coupled to the module socket.

According to yet another feature, the second controller may be adapted to concurrently communicate data traffic to and from a plurality of sockets having non-volatile memory modules coupled thereto, while the first controller may be adapted to concurrently communicate data traffic to and from just one of the sockets having volatile memory modules coupled thereto.

Exemplary Memory/Storage Module

Figure 6:
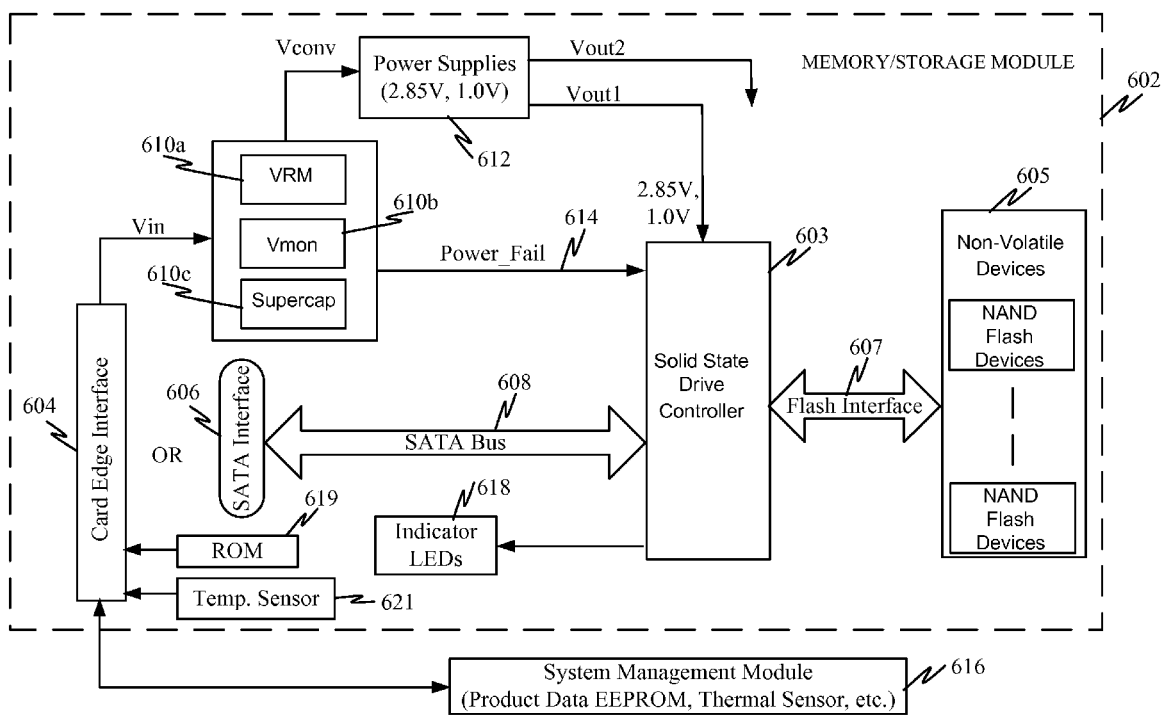
FIG. 6 is a block diagram illustrating a non-volatile memory/storage module.

FIG. 6 is a block diagram illustrating a non-volatile memory/storage module. In one example, the non-volatile memory/storage module 602 may operate as a solid state drive using a SATA interface. In this example, the memory/storage module 602 may implement a solid state drive. The memory/storage module 602 may include a card edge interface 604, a SATA interface 606, a solid state drive (SSD) controller 603, and/or a plurality of non-volatile devices 605. The card edge interface 604 may serve to secure the memory/storage module 602 to a socket (e.g., DIMM socket) of a host system (e.g., host memory bus). In one configuration (e.g., illustrated in FIGS. 1A and 1B), the memory/storage module 602 may obtain power via the card edge interface 604 and may transmit/receive data over the SATA interface 606. The SATA interface 606 may be electrically coupled to the solid state drive controller 603 via an internal SATA bus 608. The SATA interface 606 may be compliant with the SATA International Organization (IO) Serial ATA specification, v2.6 that supports SATA I and SATA II interfaces or other SATA standards (all of which are incorporated herein by reference). In another configuration (e.g., illustrated in FIGS. 2, 3, 4, and 5), the memory/storage module 602 may obtain power via the card edge interface 604 and may transmit/receive data over the card edge interface 604. The solid state drive controller 603 may be electrically coupled to the plurality of non-volatile memory/storage devices 605 via a flash interface/bus 607.

The non-volatile memory/storage module 602 may receive its power or input voltage (Vin) via the card edge interface 604. In some implementations, an on-module voltage regulator module 610*a* (e.g., power converter or power conversion circuit) may serve to convert the input voltage to a different voltage Vconv by stepping up or stepping down the input voltage Vin. The converted voltage Vconv may be used to power one or more components on the memory/storage module 602. For example, the converted voltage Vconv may power the solid state drive controller 603 and/or the plurality of non-volatile devices 605. In on example, one or more power supplies 612 may take the converted voltage Vconv as an input and provide one or more different voltages (e.g., voltages specific to the controller 603 and non-volatile devices 605) as an output. In this manner, the power supply 612 may provide a constant voltage Vout1, Vout2, etc., to the SSD controller 603, the non-volatile devices, and/or other components of the memory/storage module 602. The power supply 612 may be provided as part of the memory/storage module 602 or it may be provided as a separate daughter card that couples to the memory module (see FIG. 7).

A voltage monitor (Vmon) 610*b* may serve to determine if the input voltage Vin falls below a threshold voltage. If the input voltage Vin is below the threshold voltage, a triggering event (e.g., a power failure event, hardware signal, host system command, etc.) may have occurred causing a Power_Fail signal 614 to be sent to the SSD controller 603. The Power_Fail signal 614 may be an indicator of imminent power failure and can be used by the SSD controller 603 to safeguard data write operations to the non-volatile devices 605 (i.e., prevent data corruption). According to yet another feature, the Power_Fail signal 614 may also be used by the controller 603 to transfer data from volatile memory to the non-volatile memory prior to power down. Subsequently, when external power (input voltage Vin) is reestablished or again normal, the Power_Fail signal may be cleared, thereby indicating that data previously copied to the non-volatile devices 605 can be restored to the volatile memory.

According to an optional feature, a super-capacitor 610*c* may be adapted charge itself from the input voltage Vin and to temporarily provide power (i.e. as backup power source) to one or more components of the memory module (such as the SSD controller 603 and/or non-volatile memory devices 605) so that the data can be safely written to the non-volatile devices 605 or copied from the volatile memory upon the occurrence of a power failure. The super-capacitor 610*c* may operate as a backup power source when a low voltage or power loss event is detected. The size and/or value of the super-capacitor 610*c* may be selected to provide sufficient power and time for copying data from the volatile memory to the non-volatile devices 605. Generally, the term "super-capacitor" may refer to very high value capacitors (usually with an energy density greater than or equal to 0.5 Wh/kg). Alternatively, ultra-capacitors or electrochemical double layer capacitors may also be utilized. In the event of power failure, the super-capacitor 610*c* may holdup power supplied to the memory module long enough to store data from volatile memory to the non-volatile devices 605. The power supplied by the super-capacitor 610*c* may sustain the memory module for up to several seconds (e.g., 1 to 20 seconds) in the event of a system power failure (e.g., sufficient time to perform a complete transfer of data from volatile memory to the non-volatile devices). The size of the super-capacitor 610*c* may depend on the size or capacity of the volatile memory devices being backed up and how quickly they need to be backed up to avoid data loss. For instance, in some implementations, the super-capacitor may be from one (1) or two (2) Farad up to thirty (30) Farads or more.

An off-board system management module 616 may be in communication with the memory/storage module 602 via the host memory bus to which the card edge interface 604 connects. For example, a management bus (SMBus) interface is traditionally provided on a DDR3 DIMM allowing for identifying of memory connected on a socket. System identification of memory modules of different types may enable traffic to DDR3 DIMMs and SATA DIMMs simultaneously or concurrently, thereby increasing overall system bandwidth with or without a separate bus/cable. For this purpose, each memory module may include a Read-Only Memory (ROM) that stores information related to the function and optional feature set of the memory module, e.g., serial addressable stand-alone thermal sensor for the memory module. In this example, the Read-Only Memory (ROM) 619 stores module information (e.g., module type, memory size, etc.) which can be accessed via the card edge interface 604 to provide said module information to the host system. Furthermore, the system management module 616 may provide for real-time hardware monitoring via indicator LEDs 618. Moreover, a temperature sensor 621 may also be coupled to the card edge interface 604 to provide temperature information to the host system via the host memory bus.

Figure 7:
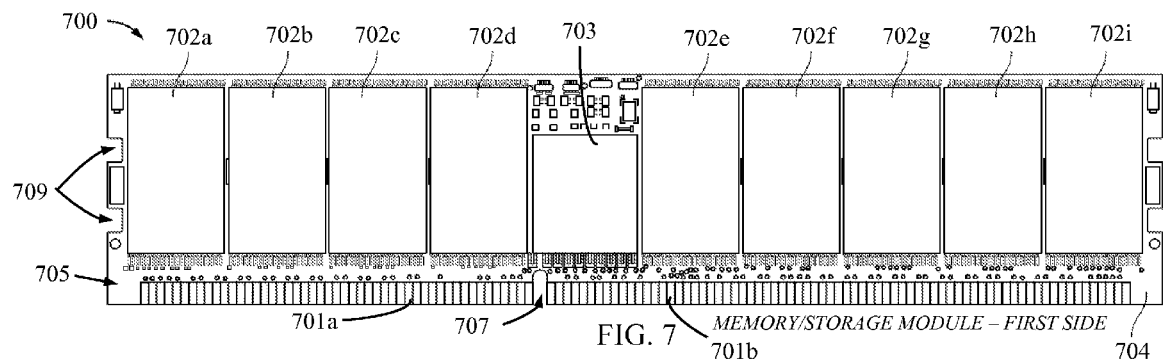
FIGS. 7, 8, and 9 illustrate a first side (front), second side (back), and perspective views of a memory/storage module.
Figure 8:
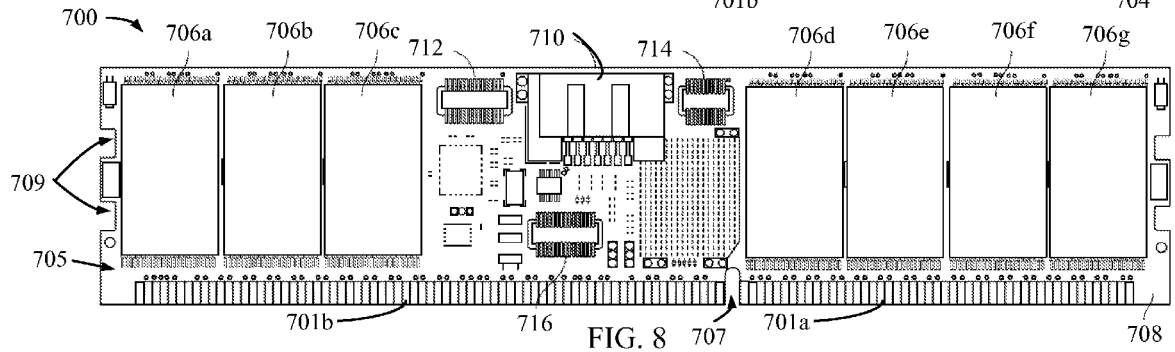

FIGS. 7, 8, and 9 illustrate a first side (front), second side (back), and perspective views of a memory/storage module 700. Note that, in this example, the memory/storage module 700 may be configured to the physical dimensions of (e.g., width, length, and/or height) of a standard memory module (e.g., DIMM) so that it may be coupled to a standard memory socket (e.g., receiving socket) for a host memory bus of a host system.

In FIG. 7, a plurality of memory/storage devices 702*a*-702*i* (e.g., non-volatile devices such as NAND Flash devices) is coupled to a first side 704 of a circuit board 705 for the memory/storage module 700. In this example, a controller 703 (e.g., solid state drive controller) may be mounted on this first side 704 which facilitates access (e.g., read operations, write operations, etc.) to/from the memory/storage devices of the memory/storage module 700. The circuit board 705 may include a first edge connector 701 (comprising 701*a* and 701*b*) having a plurality of electrical contacts that serve to couple the memory/storage module 700 to a receiving socket for a host system. Note that the electrical contacts may be placed on one or both sides of the circuit board 705. Here, the first edge connector 701 may include an offset slot 707 that is used to key the first edge connector 701 to the receiving socket. Additionally, the circuit board 705 may include a plurality of other slots 709 along its sides which may serve to engage retaining arms when installed in the receiving socket, thereby securing the memory/storage module 700 to the receiving socket.

In FIG. 8, additional memory devices 706*a*-706*g* may be coupled to a second side 708 of the memory/storage module

700. A second connector 710 for an external memory/data bus may also be provided. This second connector 710 may allow the memory/storage module 700 to send and/or receive data to/from a memory controller not coupled to the host memory bus (as in the implementation of FIGS. 1A and 1B). According to one implementation, a plurality of on-module sockets 712, 714, and 716 may be provided to allow coupling an optional daughter card to the memory/storage module 700.

Figure 9A:
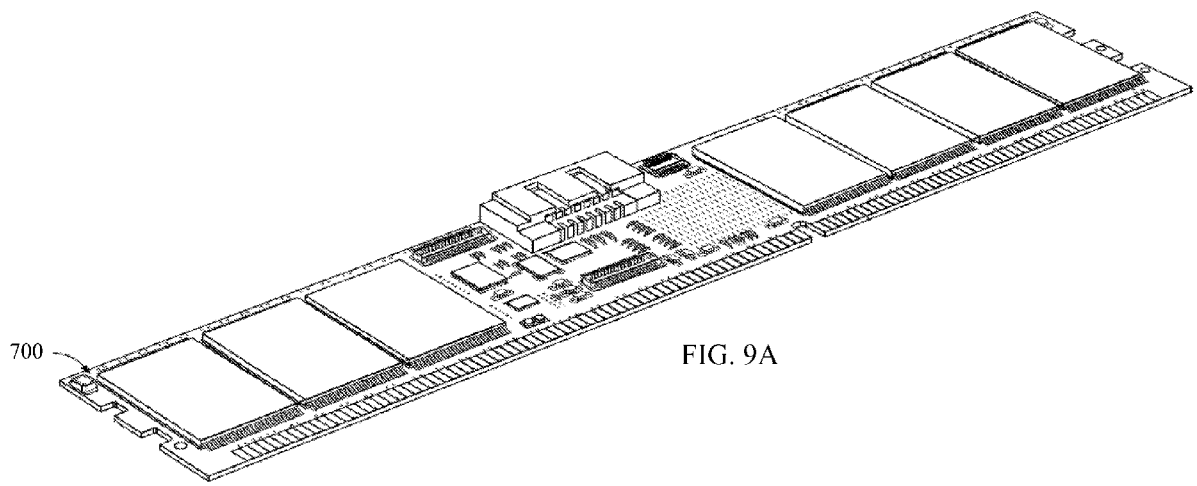
Figure 9B:
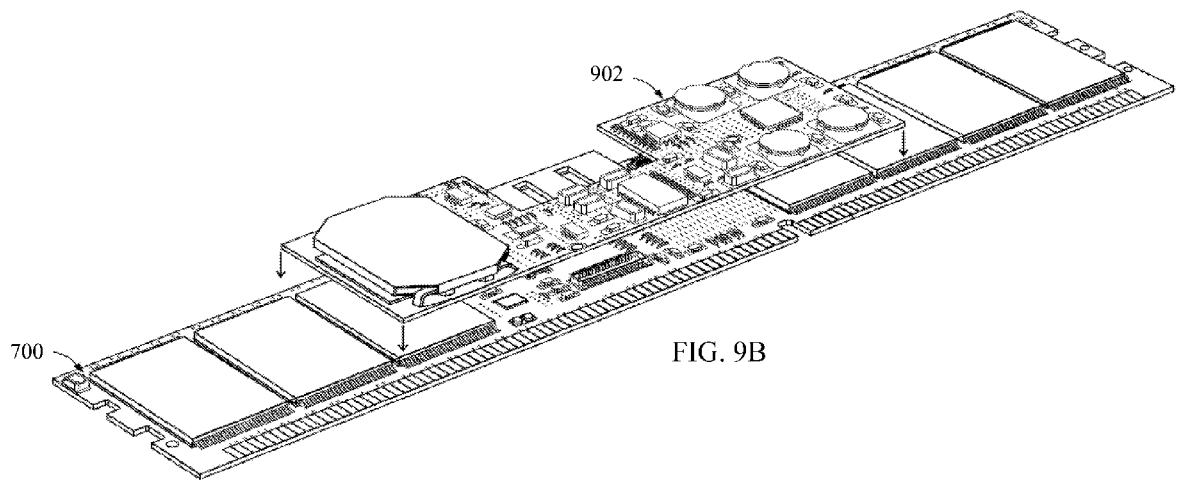
Figure 9C:
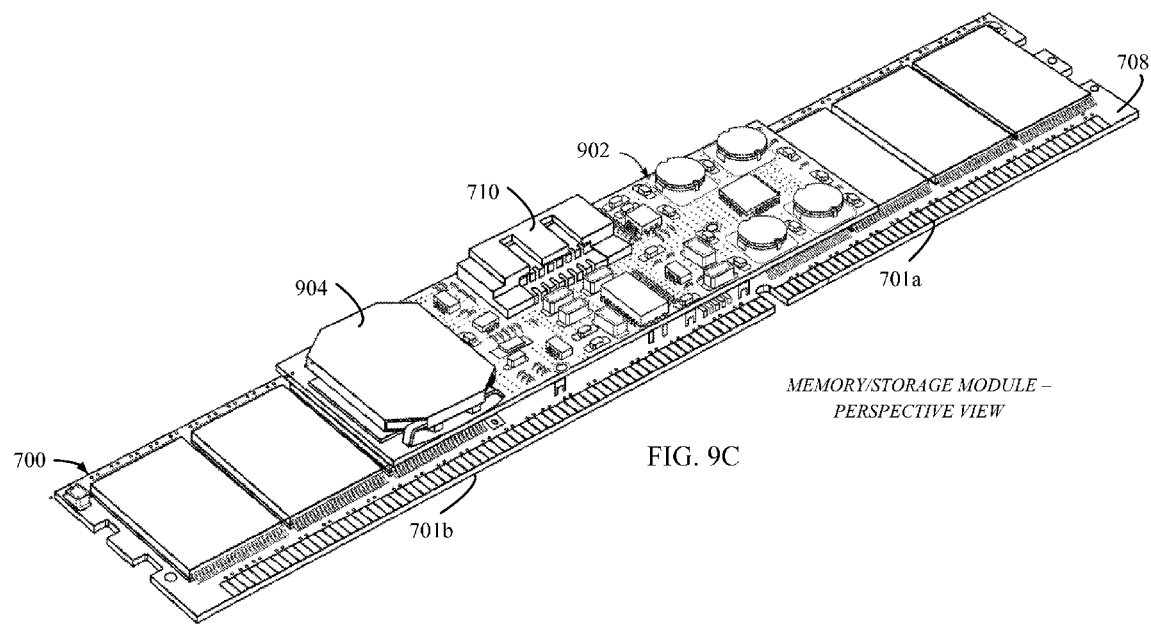

FIG. 9 (comprising FIGS. 9A, 9B, and 9C) illustrates how a removable daughter card 902 may be coupled to the memory/storage module 700. For example, the daughter card 902 may include underside electrical connectors that engage one ore more of the on-module sockets 712, 714, and 716 to electrically couple the memory/storage module 700 and daughter card 902. In one implementation, the daughter card 902 may provide power conversion to convert a first voltage (e.g., provided via the first edge connector to the memory/storage module) to a second voltage used by one or more components (e.g., controller 703, memory devices 702 and 706, etc.) of the memory/storage module 700. In other implementations, the daughter card may provide additional external interfaces, controllers, wireless transceiver, monitoring indicators, memory devices, etc., that further expand the features and/or capabilities of the memory/storage module 700. In this example, the daughter card 902 includes a super capacitor 904 mounted thereon.

Figure 10:
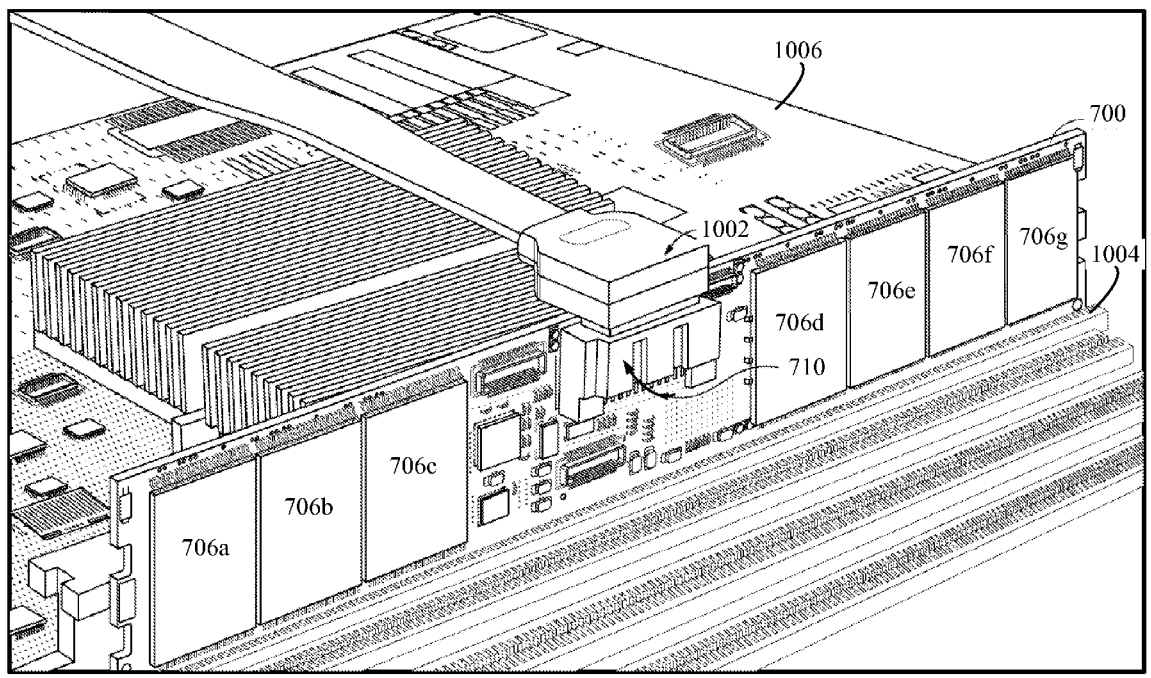
FIG. 10 illustrates the memory/storage module of FIG. 7 coupled to a socket on a host system.

FIG. 10 illustrates the memory/storage module 700 coupled to a socket 1004 on a host system 1006. The socket 1004 may be coupled to a memory bus having a first controller. However, rather than using the memory bus and first controller for data traffic, the memory/storage module 700 may couple to a second controller via an external cable 1002 coupled to the second connector 710. This allows, for example, to use the socket 1004 to secure the memory/storage module 700 to the host board 1006 and reuse certain electrical signals from the host system memory bus (e.g., voltage, ground, etc.) while using the second connector 710 to transmit/receive data from the second controller.

Figure 11A:
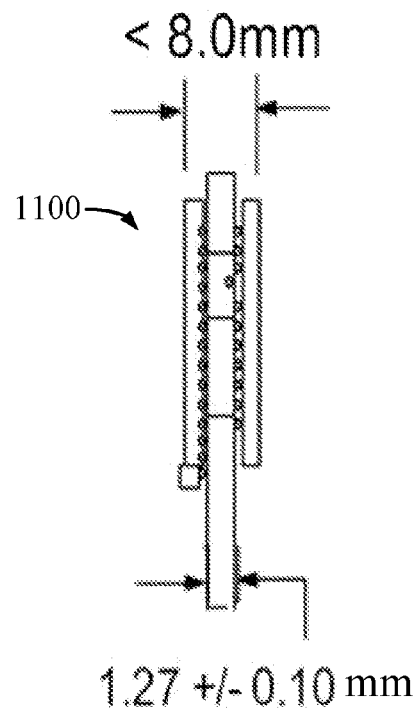
FIGS. 11A and 11B illustrate physical dimensions for one example of a memory/storage module.
Figure 11B:
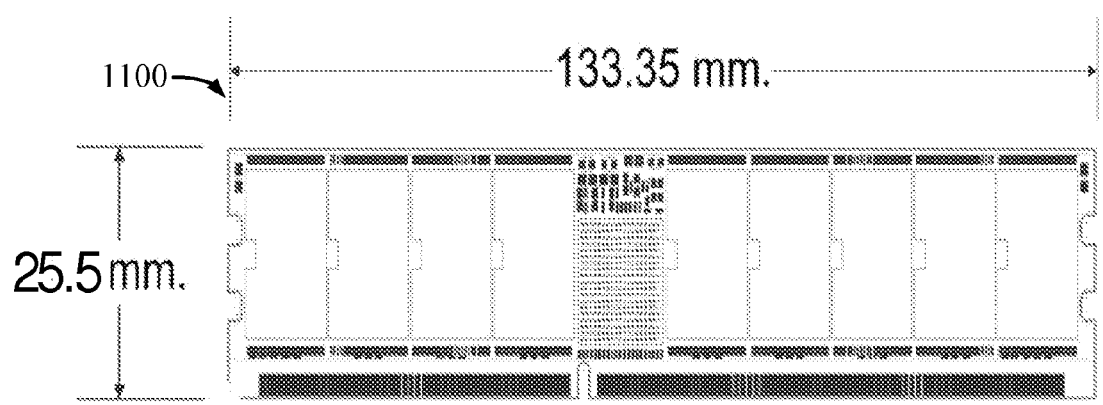

FIGS. 11A and 11B illustrate physical dimensions for one example of a memory/storage module 1100. In this example, the physical dimensions of the memory/storage module 1100 may correspond to a low-profile (LP) DIMM with approximately 8 millimeters (mm) or less in thickness, 133.35 mm wide, 25.5 mm high, and the circuit board is approximately 1.27 mm thick. In another example, the physical dimensions of the memory/storage module 1100 may correspond to a very low-profile (VLP) DIMM with approximately 8 millimeters (mm) or less in thickness, 133.35 mm wide, 18.75 mm high. In yet another example, the physical dimensions of the memory/storage module 1100 may correspond to a mini DIMM with approximately 6 millimeters (mm) or less in thickness, 82 mm wide, 30 mm high. Note that the memory/storage module may be constructed of such physical dimensions as to comply with any memory module specification (e.g., JEDEC Standard PC3-6400/PC3-8500/PC3-10600/PC3-12800 DDR3 SDRAM Unbuffered DIMM Design Specification, incorporated herein by reference).

Figure 12:
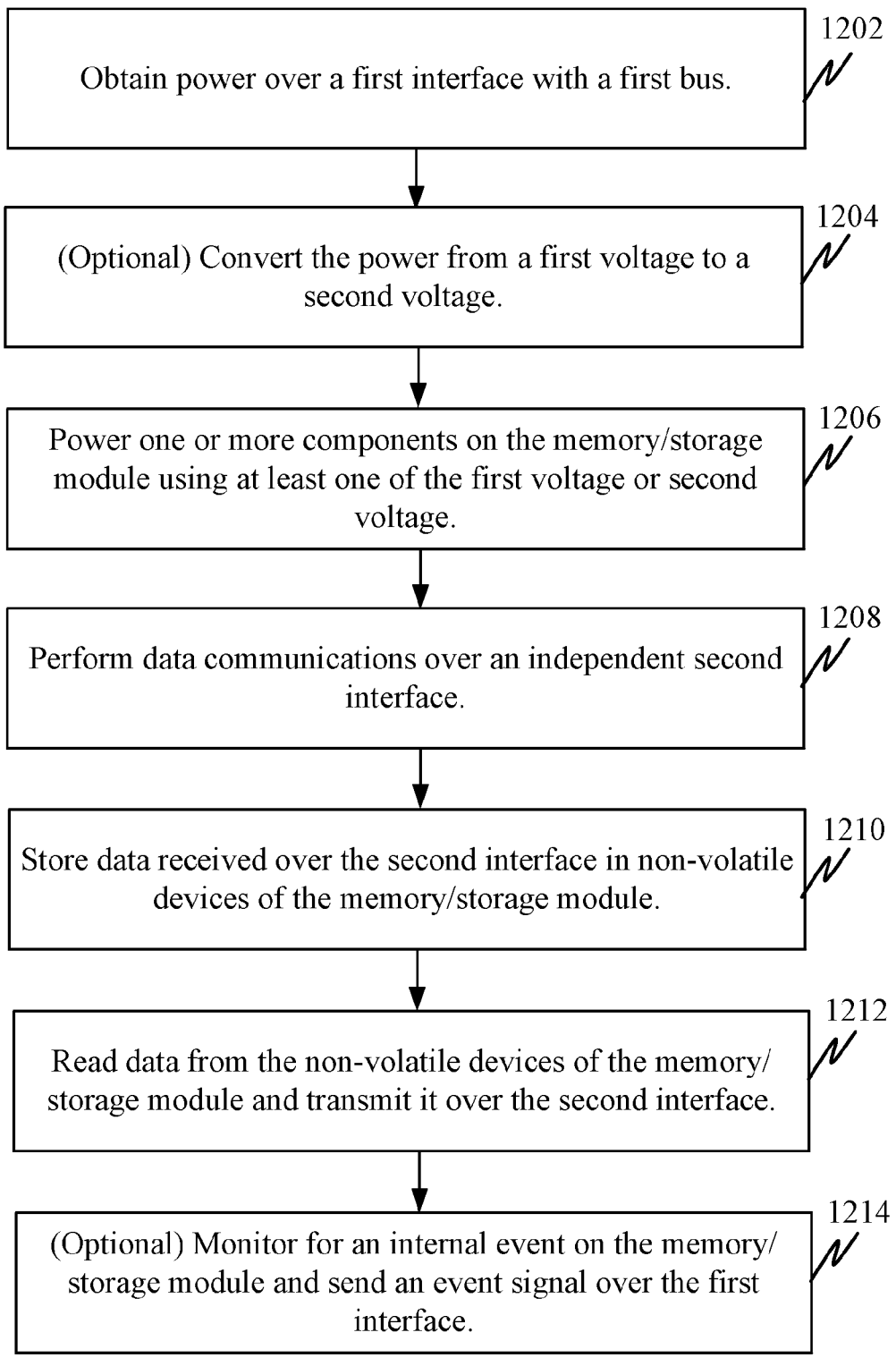
FIG. 12 illustrates a method that may be implemented on a memory/storage module that utilizes at least two bus interfaces.

FIG. 12 illustrates a method that may be implemented on a memory/storage module that utilizes at least two bus interfaces. For example, this method may be implemented in a legacy memory bus that is not capable of providing data communications for the memory/storage module (e.g., illustrated in FIGS. 1A and 1B). The memory/storage module may obtain power over a first interface with a first bus 1202 (e.g., host memory bus or legacy memory bus). Optionally, the obtained power may be converted from a first voltage to a second voltage 1204. For example, the first voltage may be a voltage that is used by the typical memory modules (e.g., volatile memory modules) coupled to the first bus while the second voltage may be a voltage for which the memory/storage module (e.g., non-volatile memory/storage module) is designed. One or more components on the memory/storage module may then be powered using at least one of the first voltage or second voltage 1206. Data communications (e.g., data traffic, data signals, etc.) to/from the memory/storage module may be performed over an independent second interface 1208. That is, data received over the second interface may be stored in non-volatile devices of the memory/storage module 1210. Likewise, data may be read from the non-volatile devices and transmitted over the second interface 1212. In one example, the second interface receives and/or transmits data using serial communications. Optionally, the memory/storage module may monitor for an internal event (e.g., thermal event) and sends an event signal over the first interface 1214.

In this manner, a memory/storage module may reuse an existing system architecture (first bus) to partially support it operations (e.g., obtain power) while using a separate second bus for data traffic. That is, there is no hardware change to the host system needed to allow the memory/storage module to operate. For example, the memory/storage module may be coupled to a host system DDR3 memory bus to obtain power but may be coupled to a SATA bus on the host system for data traffic. In this configuration, other memory modules (e.g., DDR3 compatible memory modules) may remain coupled to the host system (first bus) and can operate concurrently with the memory/storage module.

Figure 13:
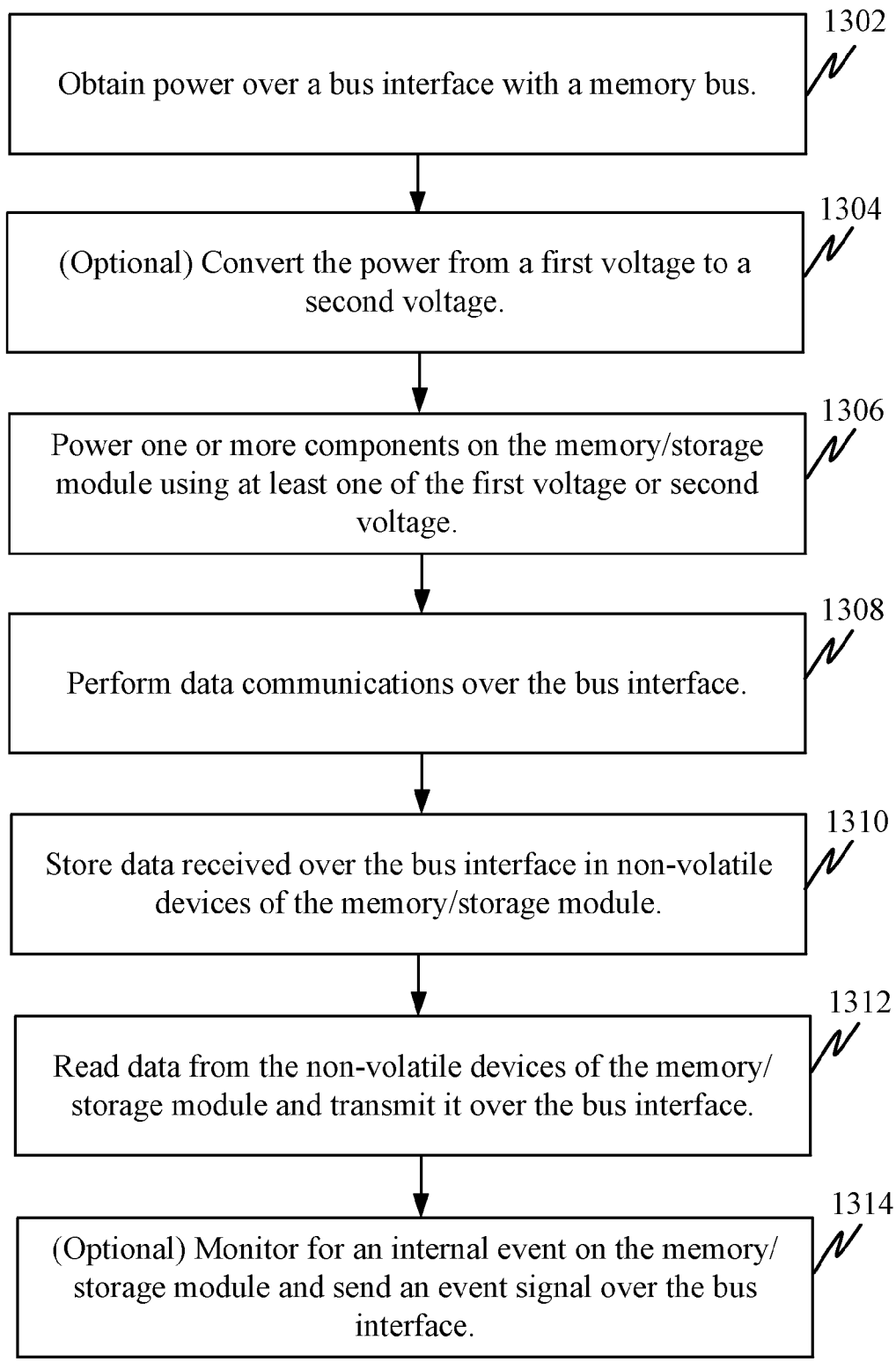
FIG. 13 illustrates another method that may be implemented on a memory/storage module that utilizes just one bus interface.

FIG. 13 illustrates another method that may be implemented on a memory/storage module that utilizes just one bus interface. For example, this method may be implemented on a memory bus that is capable of supporting data traffic for the memory/storage module. (e.g., illustrated in FIGS. 2, 3, 4, and 5). The memory/storage module (e.g., a non-volatile memory module) may obtain power over a bus interface (e.g., card edge interface to couple to a bus socket) with a memory bus 1302 (e.g., host memory bus or legacy memory bus). Optionally, the obtained power may be converted from a first voltage to a second voltage 1304. For example, the first voltage may be a voltage that is used by the typical memory modules (e.g., volatile memory modules) coupled to the memory bus while the second voltage may be a voltage for which the memory/storage module (e.g., non-volatile memory/storage module) is designed. One or more components on the memory/storage module may then be powered using at least one of the first voltage or second voltage 1306. Data communications (e.g., data traffic, data signals, etc.) to/from the memory/storage module may be performed over the bus interface 1308. Such data communications may occur over electrical paths on a receiving module socket that are unshared with other module sockets of the memory bus. That is, the electrical paths may be dedicated or specific for each receiving module socket of the memory bus. For example, such electrical paths may be used for non-data signaling (e.g., differential clock signal to the each module) when a different type of memory module (e.g., volatile memory module) is used. Data received over the bus interface may be stored in non-volatile devices of the memory/storage module 1310. Likewise, data may be read from the non-volatile devices and transmitted over the bus interface 1312. In one example, the bus interface receives and/or transmits data using serial communications. Optionally, the memory/storage module may monitor for an internal event (e.g., thermal event) and sends an event signal over the bus interface 1314.

From FIGS. 2, 3, 4, and 5 it can be appreciated that a memory module is provided, comprising: (a) a circuit board, (b) a plurality of non-volatile memory devices coupled to at least one side of the circuit board, (c) a first interface for coupling to a host memory bus and providing power to the plurality of non-volatile memory devices, and/or (d) a second interface for coupling to a secondary controller different from a primary host controller for the host memory bus. In one implementation, the first interface may be a card edge interface adapted to couple to a socket for the host memory bus and the second interface may be a socket adapted to receive a cable connector. The memory module may be accessible via the secondary controller while volatile memory modules coupled to the host memory bus are concurrently accessible via the host memory bus. The second interface may carry data traffic to and from the plurality non-volatile memory devices. For instance, the second interface may provide at least one serial communication path for accessing the plurality of non-volatile memory devices. In one example, the second interface may provide: (a) a first serial communication path for receiving data for the plurality of non-volatile memory devices; and/or (b) a second serial communication path for transmission of data from the plurality of non-volatile memory devices. In one implementation, the primary host memory controller may be a double-data-rate three (DDR3)-compatible memory controller and the secondary controller may be a Serial Advanced Technology Attachment (SATA)-compatible controller. In another implementation, the primary host memory controller may be a double-data-rate three (DDR3)-compatible memory controller and the secondary controller may be a Serial Attached Small Computer System Interface (SAS)-compatible controller.

The memory module may also comprise a solid state drive controller coupled to the second interface and the plurality of non-volatile memory devices. The solid state drive controller may be adapted to facilitate communications to and from the plurality of non-volatile memory devices over the second interface.

The memory module may also comprise a power supply adapted to obtain a first voltage from the first interface and convert the first voltage to a second voltage to power the plurality of non-volatile memory devices. The power supply may be provided at least partially on a removable daughter card that couples to the memory module. A level for the second voltage may be adaptable by using different daughter cards.

The memory module may also comprise a thermal sensor adapted to obtain a temperature for the memory module and send an event signal via the first interface if the temperature exceeds a threshold.

The memory module may also comprise a read-only memory device for storing information identifying the memory module, wherein the memory module is adapted to provide such information through the first interface to a host the host memory bus.

While the memory module may be provided in different physical dimensions, it may have a height, width, and length dimensions that complies with a specification for all memory modules to be coupled to the host memory bus.

The memory module may also be adapted to selectively send and receive data traffic for the plurality non-volatile memory devices through the second interface or the first interface, depending on which of the two interfaces is coupled to a communication path compatible with data transmissions and reception of the memory module. The communication path may be a differential pair that carry the data traffic in series. When the first interface is used for data traffic by the memory module, at least one pair of differential clock pairs of the host memory bus are repurposed for transmission of the data traffic.

Similarly, a non-volatile memory module is provided comprising: (a) a circuit board, (b) a plurality of non-volatile memory devices coupled to at least one side of the circuit board; and/or (c) a bus interface for coupling the non-volatile memory module to a host memory bus that concurrently supports a volatile memory module. The bus interface for the non-volatile memory module may use an unshared differential pair of electrical paths over the host memory bus for data traffic while the volatile memory module may use electrical paths on the host memory bus that are shared among a plurality of volatile memory modules for data traffic. The unshared differential pair of electrical paths may be a repurposed differential clock pair from the host memory bus. Concurrent support of the volatile memory module includes providing simultaneous access to the non-volatile memory module and the volatile memory module over the host memory bus. The non-volatile memory module may also comprise a solid state drive controller coupled to the plurality of non-volatile memory devices, the solid state drive controller adapted to facilitate communications to and from the plurality of non-volatile memory devices over the bus interface.

The host memory bus may have a first data throughput capacity for data traffic to the volatile memory module. However, repurposing the differential clock pair for data traffic for the non-volatile memory module effectively increases the data throughput capacity of the host memory bus to a second data throughput capacity.

In an alternative mode of operation, the host memory bus may provide power to the plurality of non-volatile memory devices through the bus interface. The memory module may include a second interface for coupling to a secondary controller different from a primary host controller for the host memory bus. The non-volatile memory module may be adapted to selectively send and receive data traffic for the plurality non-volatile memory devices through the second interface or the bus interface, depending on which of the two interfaces is coupled to a communication path compatible with data transmissions and reception of the non-volatile memory module.

The memory module may also include one or more sockets coupled to the circuit board, the one or more sockets for accepting a daughter card adapted to convert a first voltage obtained from the host memory bus to a second voltage used by the plurality of non-volatile memory devices.

According to yet another example, a memory module may comprise: (a) a circuit board, (b) a plurality of memory devices coupled to at least one side of the circuit board, (c) a controller coupled to the plurality of memory devices and adapted to send and receive data traffic; and/or (d) a bus interface for coupling the memory module to a host memory bus, wherein the controller sends and receives the data traffic serially over non-data signal paths of the host memory bus. The controller may be configured to ignore a plurality of data signal paths defined for data traffic by the host memory bus. The host memory bus may implement such data signal paths as parallel signal paths for data traffic transmission and reception.

Exemplary Module Pinout for Partial Module Support from Host Memory Bus

FIGS. 14, 15, and 16 define an exemplary pinout specification for a memory/storage module that includes a first edge interface adapted to plug into a receiving socket for a DDR-compatible memory bus while utilizing a different interface for data traffic communications over a SATA-compatible bus. An example of this configuration is illustrated in FIGS. 1A and 1B. In this example, the memory/storage module (e.g., a non-volatile memory module) may be configured to be accepted into a 240-pin DDR3 socket. Such 240-pin DDR3 socket may typically be configured for volatile memory modules having DDR3-compatible random access memory (e.g., volatile memory devices).

FIG. 14 illustrates the typical pinouts for a 240-pin DDR3 memory module. Rather than utilizing all pins, the memory/storage module may only utilize a subset of the pins on the socket and/or memory bus. FIG. 15 illustrates the pins used in this configuration. Pins 117 (SA0), 237 (SA1) and 119 (SA2) may be used to tie the system planar to either VSS (Pin 235—Supply Return voltage rail for the module) or VDDSPD (Pin 236—Serial EEPROM positive power supply) to configure the serial SPD EEPROM address range. Pin 118 may be used to clock data into and out of the module System Management Bus (SMBus) interface. Pin 238 (SDA) may be a bi-directional pin that is used to transfer data into or out of the module SMBus interface. Pins 2 (PD0) and 239 (PD1) may be used for presence detection for systems supporting module hotswap operations. Pin 187 (Event_n) may be used to indicate that a thermal event has been detected in an on-module thermal sensing device.

Having obtained power and certain support services via the card edge interface, the memory/storage module may use its second connector/interface for data traffic. For example, such second connector/interface may provide Serial Advanced Technology Attachment (ATA) communications. FIG. 16 illustrates an exemplary serial ATA connector pin signal definition that may be implemented. As can be appreciated, a bidirectional SATA channel may be implemented over seven pins, with three pins S1, S4, S7 providing signal ground, two pins S2 and S3 providing a differential receive channel, and two pins two pins S5 and S6 providing a differential transmit channel. Hence, just two electrical paths are used for data transmissions (e.g., differential Tx signal) and two other electrical paths are used for data reception (e.g., differential Rx signal).

Exemplary Module Pinout for Full Module Support from Host Memory Bus

FIGS. 17 and 18 illustrate pinouts for an exemplary DDR3 interface (pins 1-240) that may be reused or repurposed by a SATA memory module. In addition to the same pins used and discussed with reference to FIGS. 8 and 9, additional pins may be repurposed by a SATA-compatible memory module. SATA transmission and/or reception may each be achieved over a pair of signal paths by differential signaling. In this example, the pins corresponding to DDR3 clocks (i.e., differential clock pairs) have been selected for SATA transmission/reception. For instance, pins 64/65 have been selected for SATA channel 0 differential transmissions (Tx), while pins 184/185 have been selected for SATA channel 0 differential reception (Rx). Additionally, a SATA transmit/receive channel may also be transmitted over unused or reserved pins, such as pin pairs 42/43 and/or 161/162. Note that similar pin repurposing or usage may be done for memory buses operating according to different standards, including DDR4. For a host memory controller that is unaware of the SATA memory module, but systems board designs that want to implement such memory bus, CLK 0 could optionally be multiplexed between SATA and DDR to share the memory bus. It will also do no harm to those systems if they run a clock to those pins since it is received only by the SATA memory module and may be used to switch to an external SATA connector. For host memory controllers that are aware of SATA memory modules, more than the single SATA port can be used as alignment to the data strobe signals (DQS's).

Exemplary Hotplug Memory Module Implementation

Figure 19:
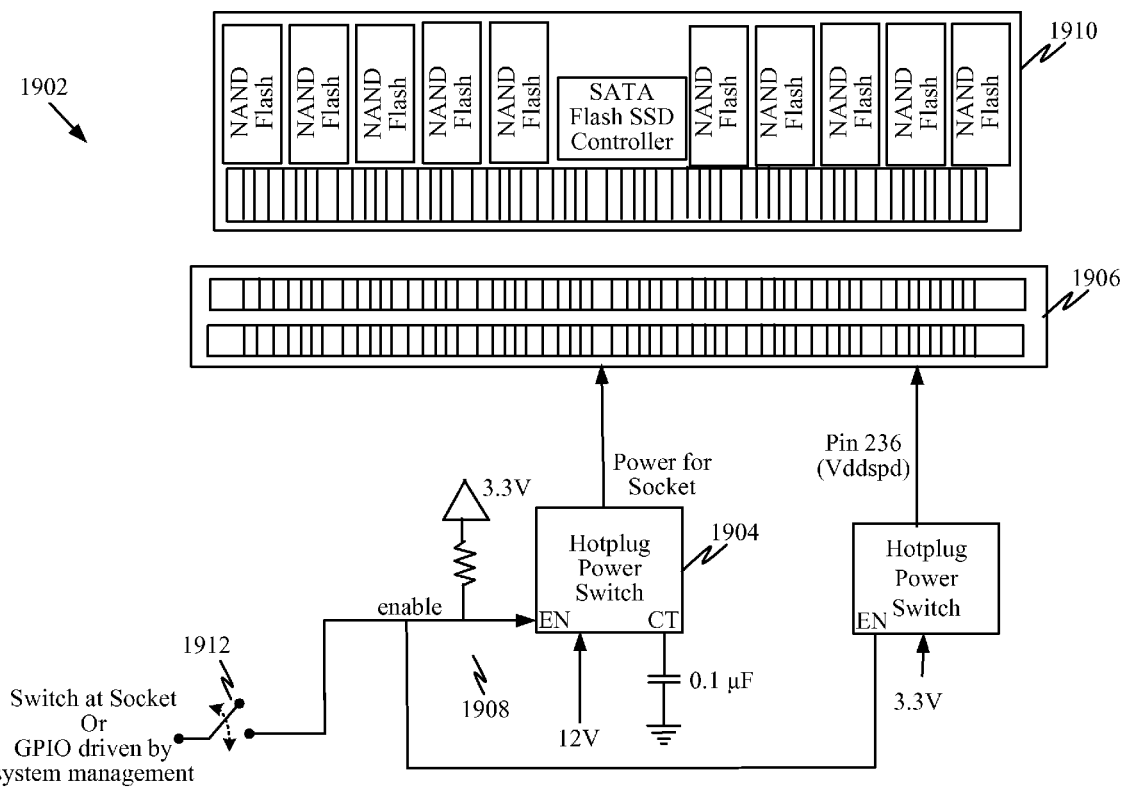
FIGS. 19 and 20 illustrate two examples of memory/storage module hotplug circuits.
Figure 20:
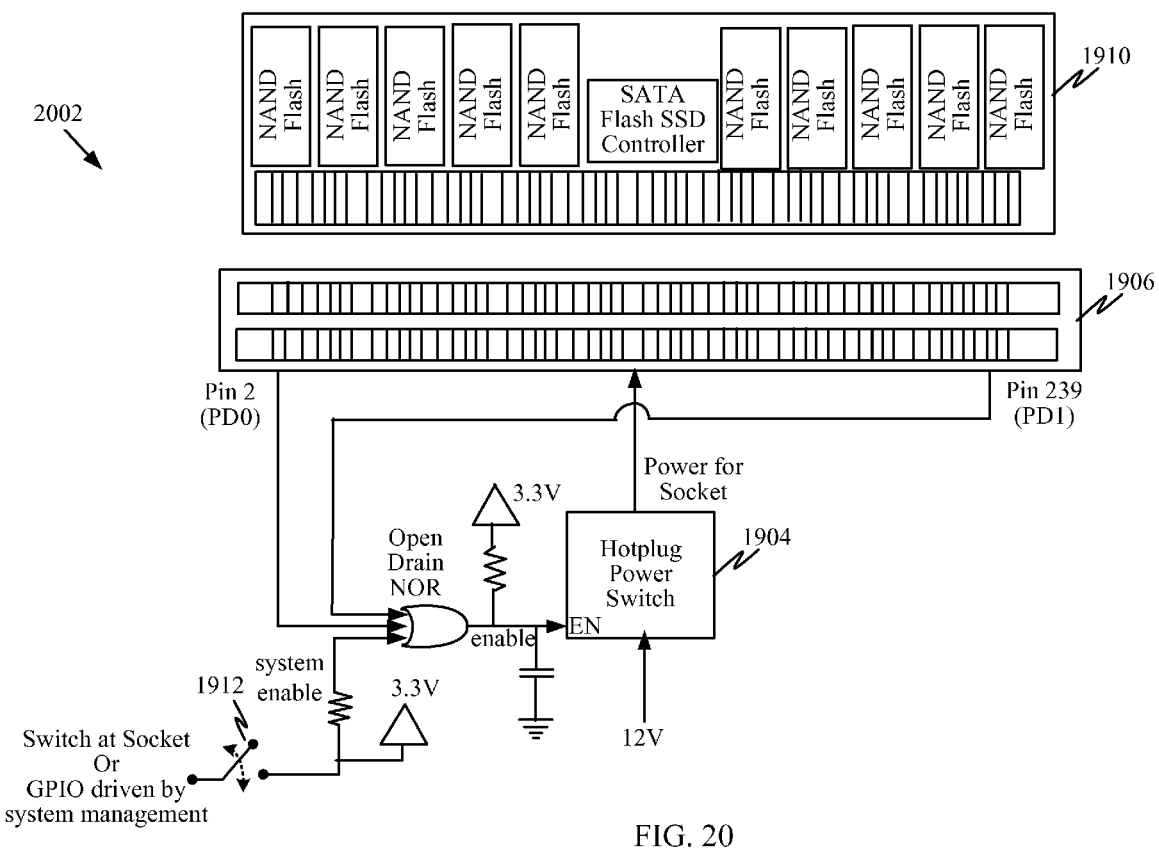

A standard DIMM socket can be enabled to allow a memory/storage module (e.g., non-volatile memory module) to be added or removed without turning off system power through a hotplug circuit. FIGS. 19 and 20 illustrate two examples of memory/storage module hotplug circuits.

FIG. 19 illustrates an example of a memory/storage module hotplug circuit that is system controlled. The hotplug circuit 1902 may include a hot plug power switch 1904 connected to a source voltage supply (12 Volts), where such voltage is supplied to a module socket 1906 (e.g., Vin/Vdd input voltage at the socket). A power switch 1912 may be controlled with a simple On or Off socket power enable signal 1908 or a general purpose I/O controlled by system management. For hot-plug and removal operations fully controlled by the host system, the system management may control the hot-plug power switch 1904 through various types of interfaces and/or general purpose I/O (GPIO) pins. An alternative design may add a physical switch or latch at each socket 1906 to enable or disable the socket power from the hotplug power switch 1904.

FIG. 20 illustrates an alternative hotplug circuit that is both host system controlled and automatic. For hotplug and removal operations that are controlled by the host but also incorporates presence detect. This circuit 2002 requires the socket 1906 be populated with a module prior to providing socket power. The hotplug circuit 2002 automatically powers the memory/storage module 1910 once it is fully seated in the socket 1906 or to wait a power on command from the host system.

Exemplary Hybrid Memory Controller

Figure 21:
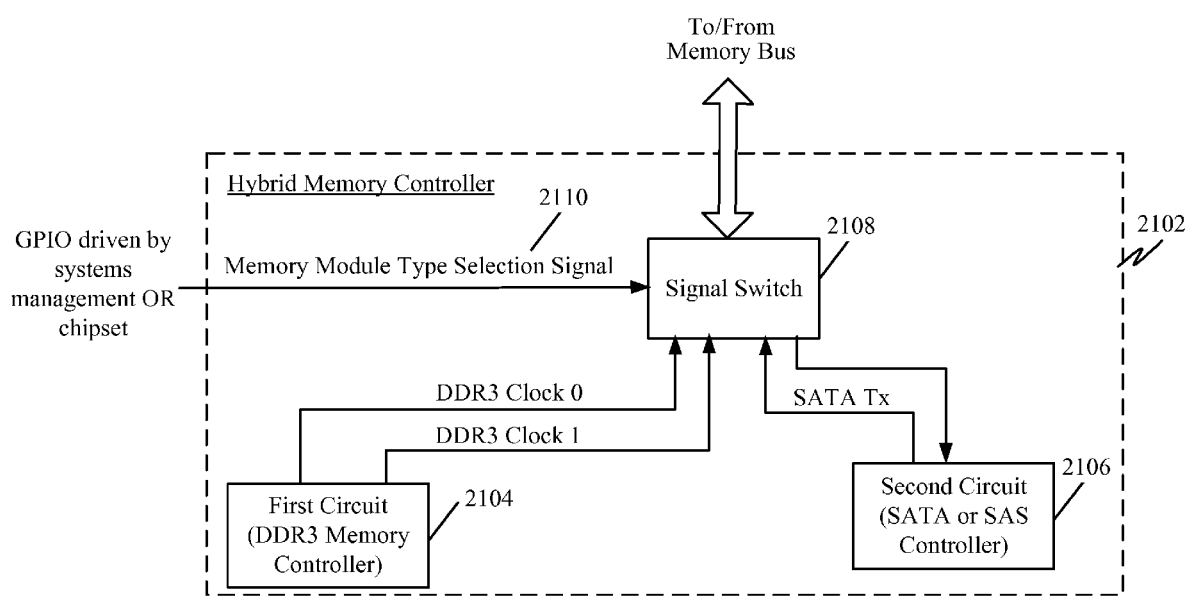
FIG. 21 illustrates an example of a hybrid memory controller.

As illustrated in FIGS. 2, 3, 4, and 5, a memory controller may be adapted for operation over a hybrid memory bus. As illustrated in FIG. 21, the memory controller 2102 may comprise: (a) a first circuit 2104, (b) a second circuit 2106, and/or (c) a signal switch 2108. The first circuit 2104 may be adapted to perform read and write operations over the hybrid memory bus according to signaling of a first memory type. The second circuit 2106 may be adapted to perform read and write operations over the hybrid memory bus according to signaling of a second memory type. The signal switch 2108 may be adapted to select a signal (or electrical path) from either the first circuit 2104 or second circuit 2106 depending on which type of memory module is coupled to a corresponding module socket on the memory bus. In one example, signaling for the first memory type may be incompatible with signaling for the second memory type. For example, the first memory type may use a shared or common data bus (over the memory bus) while the second memory type uses dedicated, separate, and/or socket-specific electrical paths for data traffic. In some implementations, the hybrid memory controller uses a plurality of socket-specific (e.g., unshared) electrical paths for different types of signals depending on whether a memory module coupled to the corresponding socket is of a first memory type (e.g., volatile memory module) or a second memory type (non-volatile memory module). If a memory module of the first memory type is detected on a particular socket (e.g., as provided by the selection signal 2110), then the signal switch 2101 sends one or more clock signals over the socket-specific electrical paths. Otherwise, if a memory module of the second memory type is detected on the same socket (e.g., as provided by the selection signal 2110), then the signal switch 2101 sends or receives one or more data traffic signals over the socket-specific electrical paths. In one example, when a memory module of the second memory type is detected, a first set of electrical paths are used to send a differential data traffic signal to the socket and a second set of electrical paths are used to receive a differential data traffic signal from the socket.

Note that the hybrid memory controller 2102 may communicate concurrently with a plurality of memory modules of the second memory type (e.g., non-volatile memory module using socket-specific data paths) and also concurrently communicate with just one memory module of the first memory type (e.g., volatile memory module using a shared data path).

In some implementations, the hybrid memory controller may include a memory module detection circuit adapted to determine whether a memory module coupled to a particular socket of the memory bus is of the first type or second type. This may be accomplished, for example, by querying a memory module serial presence detect (SPD) over a system management bus (SMBus).

One of ordinary skill in the art will recognize that, generally, most of the processing described in this disclosure may be implemented in a similar fashion. Any of the circuit(s) or circuit sections may be implemented alone or in combination as part of an integrated circuit with one or more processors. The one or more of the circuits may be implemented on an integrated circuit, an Advance RISC Machine (ARM) processor, a digital signal processor (DSP), a general purpose processor, an application specific integrated circuit (ASIC), a field-programmable gate array (FPGA), etc.

It is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

As used in this application, the terms "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Moreover, a storage medium may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

One or more of the components, steps, and/or functions illustrated in the Figures may be rearranged and/or combined into a single component, step, or function or embodied in several components, steps, or functions without affecting the operation. Additional elements, components, steps, and/or functions may also be added without departing from the invention. The apparatus, devices, and/or components illustrated in the Figures may be configured to perform one or more of the methods, features, or steps described in the Figures. The novel algorithms described herein may be efficiently implemented in software and/or embedded hardware.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A memory module, comprising:
a circuit board;
a plurality of non-volatile memory devices coupled to at least one side of the circuit board;
a first connector, operationally coupled to a host memory bus and providing power to the plurality of non-volatile memory devices;
a second connector, distinct from the first connector, operationally coupled to a secondary controller different from a primary host controller for the host memory bus; and
a power supply adapted to obtain a first voltage from the first connector and convert the first voltage to a second voltage to power the plurality of non-volatile memory devices, wherein a level for the second voltage is adaptable by using different daughter cards.

2. The memory module of claim 1, wherein the first connector is a card edge interface adapted to couple to a socket for the host memory bus.

3. The memory module of claim 2, wherein the second connector is a socket adapted to receive a cable connector.

4. The memory module of claim 1, wherein the memory module is accessible via the secondary controller while volatile memory modules coupled to the host memory bus are concurrently accessible via the host memory bus.

5. The memory module of claim 1, wherein the second connector carries data traffic to and from the plurality non-volatile memory devices.

6. The memory module of claim 1, wherein the second connector provides at least one serial communication path for accessing the plurality of non-volatile memory devices.

7. The memory module of claim 1, wherein the second connector provides:
a first serial communication path for receiving data for the plurality of non-volatile memory devices; and
a second serial communication path for transmission of data from the plurality of non-volatile memory devices.

8. The memory module of claim 1, wherein the primary host controller is a double-data-rate three (DDR3)-compatible memory controller and the secondary controller is a Serial Advanced Technology Attachment (SATA)-compatible controller.

9. The memory module of claim 1, wherein the primary host controller is a double-data-rate three (DDR3)-compatible memory controller and the secondary controller is a Serial Attached Small Computer System Interface (SAS)-compatible controller.

10. The memory module of claim 1, further comprising:
a solid state drive controller coupled to the second connector and the plurality of non-volatile memory devices, the solid state drive controller adapted to facilitate communications to and from the plurality of non-volatile memory devices over the second connector.

11. The memory module of claim 1, wherein the power supply is provided at least partially on a removable daughter card that couples to the memory module.

12. The memory module of claim 1, further comprising:
a thermal sensor adapted to obtain a temperature for the memory module and send an event signal via the first connector if the temperature exceeds a threshold.

13. The memory module of claim 1, wherein the memory module has a height, width, and length dimensions that comply with a specification for all memory modules to be coupled to the host memory bus.

14. The memory module of claim 1, further comprising:
a read-only memory device for storing information identifying the memory module, wherein the memory module is adapted to provide such information through the first connector to the host memory bus.

15. The memory module of claim 1, wherein the memory module is adapted to selectively send and receive data traffic for the plurality non-volatile memory devices through the second connector or the first connector, depending on which of the two connectors is coupled to a communication path compatible with data transmissions and reception of the memory module.

16. The memory module of claim 15, wherein the communication path is a differential pair that carry the data traffic in series.

17. A memory module, comprising:
a circuit board;
a plurality of non-volatile memory devices coupled to at least one side of the circuit board;
a first connector, operationally coupled to a host memory bus and providing power to the plurality of non-volatile memory devices; and
a second connector, distinct from the first connector, operationally coupled to a secondary controller different from a primary host controller for the host memory bus; wherein the memory module is adapted to selectively send and receive data traffic for the plurality non-volatile memory devices through the second connector or the first connector, depending on which of the two connectors is coupled to a communication path compatible with data transmissions and reception of the memory module, and when the first connector is used for data traffic by the memory module, at least one pair of differential clock pairs of the host memory bus are repurposed for transmission of the data traffic.

18. A non-volatile memory module, comprising:
a circuit board;
a plurality of non-volatile memory devices coupled to at least one side of the circuit board; and
a bus interface for coupling the non-volatile memory module to a host memory bus that concurrently supports a volatile memory module,
wherein the bus interface for the non-volatile memory module uses an unshared differential pair of electrical paths over the host memory bus for data traffic while the volatile memory module uses electrical paths on the host memory bus that are shared among a plurality of volatile memory modules for data traffic,
wherein the unshared differential pair of electrical paths are a repurposed differential clock pair from the host memory bus.

19. The non-volatile memory module of claim 18, wherein the host memory bus has a first data throughput capacity for data traffic to the volatile memory module, and repurposing the differential clock pair for data traffic for the non-volatile memory module effectively increases the data throughput capacity of the host memory bus to a second data throughput capacity.

20. The non-volatile memory module of claim 18, wherein concurrent support of the volatile memory module includes providing simultaneous access to the non-volatile memory module and the volatile memory module over the host memory bus.

21. The non-volatile memory module of claim 18, further comprising:
a solid state drive controller coupled to the plurality of non-volatile memory devices, the solid state drive controller adapted to facilitate communications to and from the plurality of non-volatile memory devices over the bus interface.

22. The non-volatile memory module of claim 18, wherein the host memory bus provides power to the plurality of non-volatile memory devices through the bus interface, and further comprising:
a second interface for coupling to a secondary controller different from a primary host controller for the host memory bus.

23. The non-volatile memory module of claim 22, wherein the non-volatile memory module is adapted to selectively send and receive data traffic for the plurality non-volatile memory devices through the second interface or the bus interface, depending on which of the two interfaces is coupled to a communication path compatible with data transmissions and reception of the non-volatile memory module.

24. The non-volatile memory module of claim 18, further comprising:
one or more sockets coupled to the circuit board, the one or more sockets for accepting a daughter card adapted to convert a first voltage obtained from the host memory bus to a second voltage used by the plurality of non-volatile memory devices.

* * * * *